(12) United States Patent
Konttinen et al.

(10) Patent No.: US 7,394,841 B1
(45) Date of Patent: Jul. 1, 2008

(54) LIGHT EMITTING DEVICE FOR VISUAL APPLICATIONS

(75) Inventors: Janne Konttinen, Tampere (FI); Pietari Tuomisto, Tampere (FI); Tomi Jouhti, Helsinki (FI)

(73) Assignee: EpiCrystals Oy, Tampere (FI)

( * ) Notice: Subject to any disclaimer, the term of this patent is extended or adjusted under 35 U.S.C. 154(b) by 0 days.

(21) Appl. No.: 11/654,557

(22) Filed: Jan. 18, 2007

(51) Int. Cl.
*H01S 5/00* (2006.01)

(52) U.S. Cl. ............... 372/45.013; 372/21; 372/22; 372/99

(58) Field of Classification Search ............ 372/45.013, 372/21, 22
See application file for complete search history.

(56) References Cited

U.S. PATENT DOCUMENTS

| | | | |
|---|---|---|---|
| 4,658,402 A | 4/1987 | Kobayashi | |
| 4,807,238 A | 2/1989 | Yokomori | |
| 5,597,740 A | 1/1997 | Ito et al. | |
| 6,072,815 A * | 6/2000 | Peterson | 372/36 |
| 6,081,541 A | 6/2000 | Adachi et al. | |
| 6,259,713 B1 | 7/2001 | Hwu et al. | |
| 6,373,865 B1 * | 4/2002 | Nettleton et al. | 372/10 |
| 6,611,544 B1 | 8/2003 | Jiang et al. | |
| 2002/0136255 A1 | 9/2002 | Takayama et al. | |
| 2003/0030756 A1 | 2/2003 | Kane et al. | |
| 2006/0023757 A1 | 2/2006 | Mooradian et al. | |
| 2006/0291516 A1 | 12/2006 | Aoki | |

OTHER PUBLICATIONS

International Search Report—Oct. 12, 2007.
Written Opinion of the International Searching Authority—Oct. 12, 2007.

* cited by examiner

*Primary Examiner*—Dung T Nguyen
(74) *Attorney, Agent, or Firm*—Venable LLP; Eric J. Franklin

(57) ABSTRACT

A light emitting device comprises a waveguide having an electrically pumped gain region, a nonlinear medium, and an inclined mirror. Light pulses emitted from the gain region are reflected by the inclined mirror into the nonlinear medium in order to generate frequency-doubled light pulses. The gain region and the inclined mirror are implemented on the same substrate. The resulting structure is stable and compact, and allows on-wafer testing of produced emitters. The folded structure allows easy alignment of the nonlinear crystal.

20 Claims, 21 Drawing Sheets

LIGHT EMITTING DEVICE FOR VISUAL APPLICATIONS

FIELD OF THE INVENTION

The present invention relates to light-emitting devices, in particular to devices which are adapted to emit light for visual applications.

BACKGROUND OF THE INVENTION

An image projector may comprise a light source to provide light for a modulator array. Light transmitted or reflected from the pixels of said modulator array may be subsequently projected on an external screen by projecting optics in order to display images.

The high optical intensity and the low divergence provided by a laser light source would be attractive properties when implementing an image projector. However, the wavelengths of powerful semiconductor laser emitters are typically in the red or infrared (IR) regions.

It is known that blue and/or green light for visual applications may be generated by frequency-doubling. Patent publication US 2006/23757 discloses a mode-locked surface-emitting laser having a nonlinear crystal for frequency-doubling.

SUMMARY OF THE INVENTION

The object of the invention is to provide a device adapted to emit light at one or more visible wavelengths.

According to a first aspect of the invention, there is provided a light emitting device comprising:
  a waveguide having an electrically pumped gain region,
  a saturable absorber,
  a reflecting structure,
  a substrate, and
  a nonlinear medium,
wherein said saturable absorber and said gain region are adapted to emit first light pulses from an end of said waveguide, said reflecting structure being adapted to reflect said first light pulses into said nonlinear medium, said nonlinear medium being adapted to generate second light pulses such that the optical frequency of said second light pulses is two times the optical frequency of said first light pulses; said gain region, said saturable absorber and said reflecting structure being implemented on said substrate such that said reflecting structure is adapted to change the direction of said first light pulses by an angle which is in the range of 70 to 110 degrees.

According to a second aspect of the invention, there is provided a method for generating light pulses by using a waveguide having an electrically pumped gain region, a saturable absorber, a reflecting structure, a substrate, and a nonlinear medium, said gain region, said saturable absorber and said reflecting structure being implemented on said substrate, said method comprising:
  providing first light pulses from an end of said waveguide by using said saturable absorber and said gain region,
  changing the direction of said first light pulses by an angle which is in the range of 70 to 110 degrees by said reflecting structure, and
  coupling said first light pulses into said nonlinear medium in order to generate second light pulses such that the optical frequency of said second light pulses is two times the optical frequency of said first light pulses.

According to a third aspect of the invention, there is provided a projecting device comprising:
  a light source, and
  projecting optics,
said light source in turn comprising
  a waveguide having an electrically pumped gain region,
  a saturable absorber,
  a reflecting structure,
  a substrate, and
  a nonlinear medium,
wherein said saturable absorber and said gain region are adapted to emit first light pulses from an end of said waveguide, said reflecting structure being adapted to reflect said first light pulses into said nonlinear medium, said nonlinear medium being adapted to generate second light pulses such that the optical frequency of said second light pulses is two times the optical frequency of said first light pulses; said gain region, said saturable absorber and said reflecting structure being implemented on said substrate such that said reflecting structure is adapted to change the direction of said first light pulses by an angle which is in the range of 70 to 110 degrees.

Thanks to the inclined reflecting structure, the operation of light emitters may be tested already on a wafer, before the emitters are separated from the wafer.

Thanks to the inclined reflecting structure, the nonlinear crystal may be aligned easily with respect to the emitted fundamental light beam.

The implementation of the gain region, the saturable absorber, and the inclined reflecting structure on the common substrate provides considerable stability when compared with a linear edge-emitting arrangements of prior art.

In an embodiment, the gain region, the saturable absorber, the inclined reflecting structure and the nonlinear crystal are attached on a common semiconducting substrate, which provides a stable structure.

Solid-gas interfaces may cause adverse reflections in the optical cavity. These reflections may be minimized e.g. by antireflection coatings. However, implementing of an antireflection coating directly on the end of the gain region may be problematic due to the small size of the coated area. In an embodiment, the antireflection coating may be implemented on the surface of the substrate instead of a cleaved edge of an emitter, thanks to the inclined reflecting structure.

The high peak intensity may also lead to catastrophic optical damage (COD) in a semiconductor facet. In an embodiment, the high intensity at the cleaved edge of an emitter may be avoided. Thanks to the inclined reflecting structure, the optical power of the emitted fundamental light beam may be distributed over a larger area on the surface of the substrate, which results in a reduced intensity. The substrate may be selected to have a wider band gap than the edge of a conventional edge-emitting semiconductor laser, and consequently the substrate material may have a higher threshold intensity for catastrophic optical damage.

In an embodiment, very short light pulses may be generated by a Q-switched arrangement where the nonlinear crystal comprises a Bragg grating to provide frequency-selective optical feedback to the gain region through said crystal. The reflectivity of the combination of the crystal and the grating may be substantially reduced at high intensity values, which may allow generation of light pulses by cavity dumping.

The light-emitting device is adapted to emit short light pulses at a high repetition rate. The duration of the pulses may be e.g. in the range of 500 fs to 1 ns. The repetition rate of the pulses may be e.g. in the order of 100 MHz to 100 GHz. The successive pulses have short coherence length and they are substantially non-coherent with each other. Consequently, the pulsed light creates a lower speckle contrast than light provided by a continuously operating laser. An image formed by coherent light typically creates annoying speckle patterns when viewed visually.

The speckle contrast may be substantially reduced when the light source provides short light pulses at a high repetition rate. Thanks to the short duration of the pulses, the pulses have a broad spectrum which further reduces speckle contrast.

In an embodiment, the light-emitting device comprises a plurality of emitters adapted to emit light pulses substantially independently. Consequently, the speckle contrast may be substantially reduced when compared with single-emitter devices. The high speckle contrast is typically rather annoying to look at, and it reduces the quality of an projected image.

Thanks to the pulsed operation, the peak power may be substantially higher than the peak power of a continuously operating laser device, when the devices have the same average power. The peak optical power may be e.g. greater than 10 times the average optical power, or even greater than 100 times the average optical power. Consequently, the efficiency of second harmonic generation in a nonlinear crystal may be substantially increased.

Thanks to the pulsed operation at a high repetition rate, the device consumes less electrical power than a continuously operating device providing the same optical power at the same visible wavelength. Consequently, the device may operate at a lower temperature and the operating reliability may be higher. Consequently, the weight and the size of the required cooling units may be reduced.

The energy of an individual light pulse may be selected to be so small that it does not cause damage in a human eye. The energy of an individual light pulse may be e.g. substantially smaller than 1 nJ. In an embodiment, the light-emitting device may be considered to provide substantially non-coherent light. Official regulations governing the use of a non-coherent light source may be less stringent in certain states.

The polarization stability is better when compared with vertical cavity surface-emitting laser (VCSEL) arrangements of prior art. In an embodiment, the polarization stability allows effective use of a periodically poled nonlinear crystal.

The embodiments of the invention and their benefits will become more apparent to a person skilled in the art through the description and examples given herein below, and also through the appended claims.

BRIEF DESCRIPTION OF THE FIGURES

In the following examples, the embodiments of the invention will be described in more detail with reference to the appended drawings in which.

DETAILED DESCRIPTION

Figure 1:
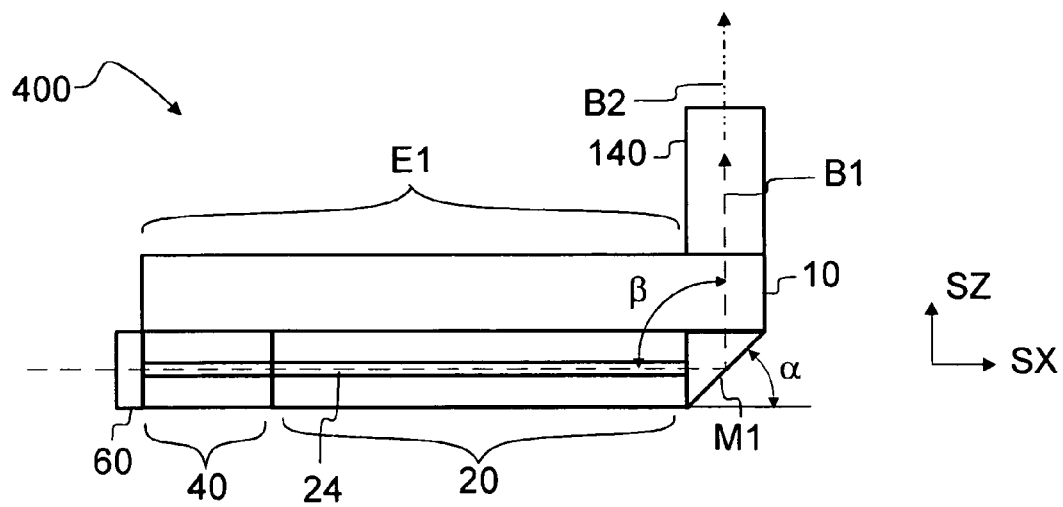
FIG. 1 shows, in a side view, a light-emitting device comprising a gain region, a saturable optical absorber, an inclined reflecting structure, and a nonlinear crystal.

Referring to FIG. 1, a light emitting device 400 comprises a waveguide 24 having a gain region 20, said device 400 further comprising a semiconductor saturable absorber 40, a first reflecting structure 60, a second reflecting structure M1, a substrate 10, and a nonlinear crystal 140. The combination of the saturable absorber 40 and the first reflecting structure 60 is also known by the acronym SESAM (semiconductor saturable absorber mirror). The second reflecting structure M1 is herein called also as the inclined reflecting structure M1. The first reflecting structure 60 is herein called also as the back reflector 60. The gain region 20, the saturable absorber 40, and the inclined reflecting structure M1 are implemented on the same substrate 10.

A laser emitter E1 may comprise the back reflector 60, the saturable absorber 40, and the gain region 20. The emitter E1 of FIG. 1 may provide laser light if the gain of the gain region is selected to be sufficiently high. The emitter E1 provides light pulses B1 from a first end of the waveguide 24. The light pulses B1 are coupled into the nonlinear crystal 140 in order to provide second light pulses B2 having double optical frequency and half wavelength when compared with the light B1, i.e. to provide second harmonic generation (SHG). In other words, the nonlinear medium 140 is adapted to generate second light such that the optical frequency of the light B2 provided by the nonlinear crystal is two times the optical frequency of the light B1.

The inclined reflecting structure M1 is adapted to reflect the light beam B1 emitted from the waveguide 24 into the nonlinear crystal 140. The inclined reflecting structure M1 is adapted to change the direction of the light beam B1 by an angle β which is in the range of 70 to 110 degrees. In particular, said angle β may be substantially equal to 90 degrees.

Figure 23:
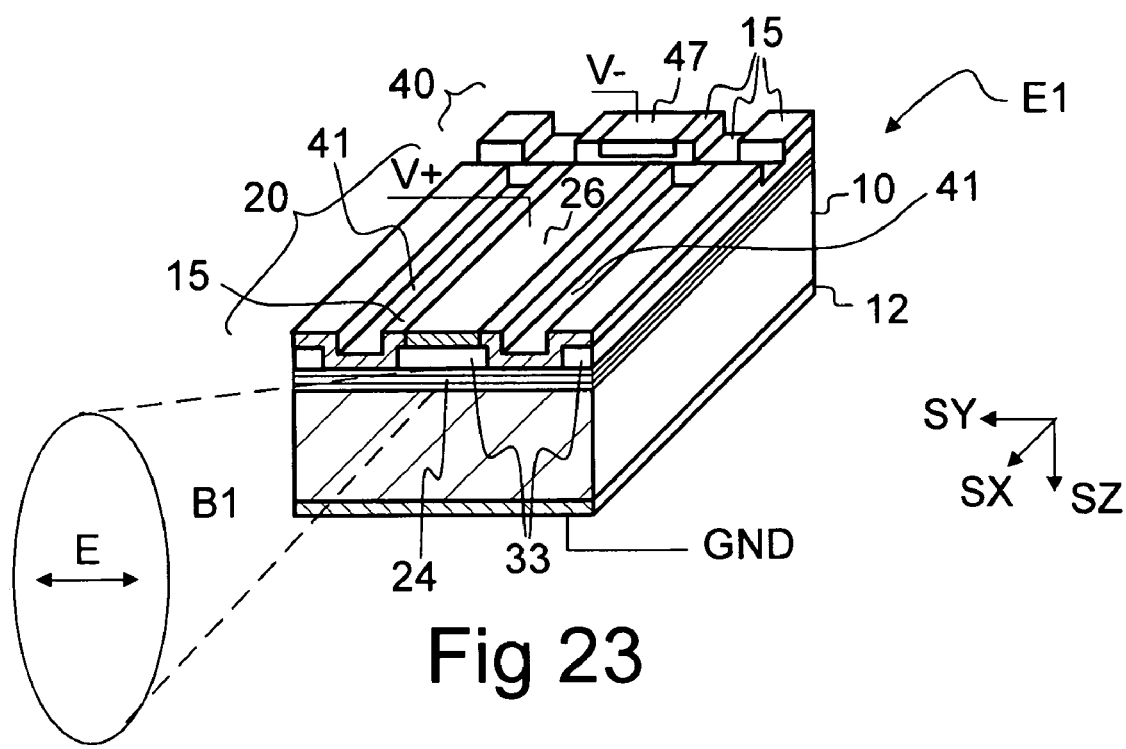

The waveguide 24 may be a ridge waveguide, i.e. it may have the form of a ridge (see FIG. 23). The waveguide 24 is parallel to a horizontal direction SX. Light which propagates longitudinally, i.e. substantially in the direction SX in the waveguide is confined to said waveguide 24 by total internal reflections on the sides of the waveguide.

The inclined reflecting structure M1 may be adapted to reflect the light beam B1 provided by the emitter E1 substantially in a vertical direction SZ. The direction SZ is perpendicular to the direction SX. If the inclined reflecting structure M1 is a reflecting surface, such as a mirror, the angle α between the reflective surface and the direction SX may be in the range of 35-55 degrees. In particular, the angle α may be substantially 45 degrees.

The common substrate 10 may be substantially transparent in the wavelength or wavelengths of the light beam B1, in order to allow the beam B1 to pass vertically through said common substrate 10. Also the nonlinear crystal 140 may be attached to the same common substrate 10 when the light beam B1 is reflected through said substrate 10 into the crystal 140.

Positioning of the nonlinear crystal 140 onto a substantially horizontal surface of the common substrate 10, and directing the light beam B1 substantially vertically into said crystal 140 may allow easier alignment of the crystal 140 with respect to the beam B1 than in a linear arrangement without said inclined reflecting structure M1. Such linear arrangements are shown e.g. in FIGS. 32 and 33.

Figure 24:
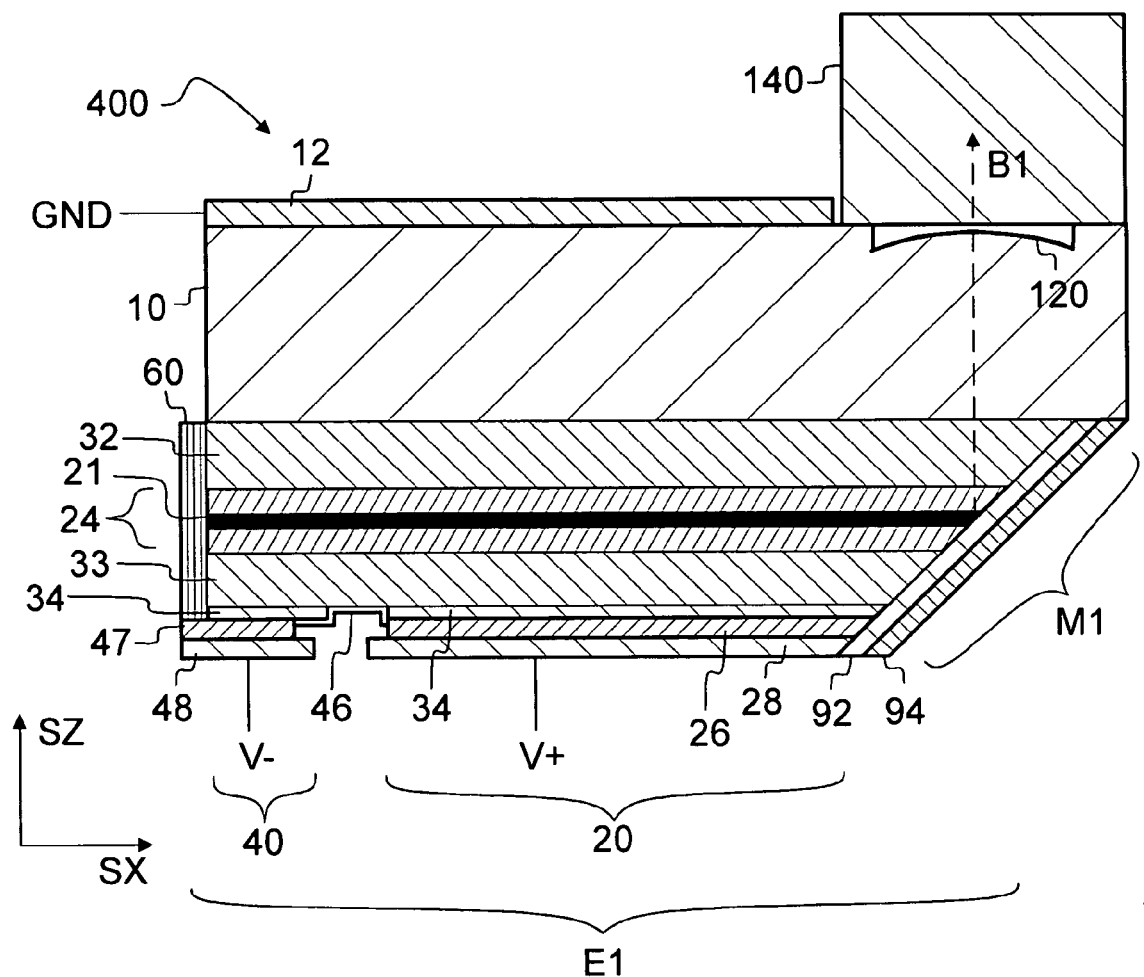
FIG. 24 shows, in a side view, structural layers of a light-emitting device which comprises an inclined reflecting structure.

The inclined reflecting structure M1 may be implemented by an inclined end of the waveguide (FIG. 24).

The back reflector 60 may be in contact with the waveguide 24 or there may be a space between them. The waveguide 24 may be in contact with the inclined reflecting structure M1, or there may be a space between them. The nonlinear crystal 140 may be in contact with the common substrate 10 or there may be a space between them. The saturable absorber 40 may be in contact with the gain region 20, or there may be a space between them. The optical surfaces may have antireflective (AR) coatings.

The second reflecting structure M1 may also be a diffractive grating, which may be implemented e.g. on the side of the waveguide 24 to diffract the light beam B1 substantially vertically towards the nonlinear crystal 140. It is emphasized that said grating may also be substantially parallel to the waveguide 24, thus the second reflecting structure M1 does not necessarily need to be "inclined" with respect to the waveguide 24.

The re-directing of the light beam B1 by using the inclined reflecting structure M1 may allow implementing a stable folded structure.

The back reflector 60 is adapted to reflect light emitted from a second end of the gain region 20 through the saturable absorber 40 back into said gain region 20, i.e. in the direction SX. The reflectivity of the first reflecting structure 60 is selected to provide sufficient optical feedback. The reflectivity of the first reflecting structure 60 may be e.g. in the range of 30-95%. The first reflecting structure 60 may be implemented e.g. by a cleaved end of the waveguide 24.

Thanks to the integrated inclined reflecting structure, the operation of the emitter E1 may be tested before it is separated from a wafer. Thus, any faulty emitters E1 may be identified before further processing, and cost savings may be expected.

Thus, a method of manufacturing the light emitting device 400 may comprise
- implementing a gain region 20 on a substrate wafer 10,
- implementing a saturable absorber 40 on said substrate wafer 10,
- implementing a reflecting structure M1 on said substrate wafer 10, and
- measuring at least one performance parameter based on the first light pulses B1 reflected by said reflecting structure M1.

Figure 2:
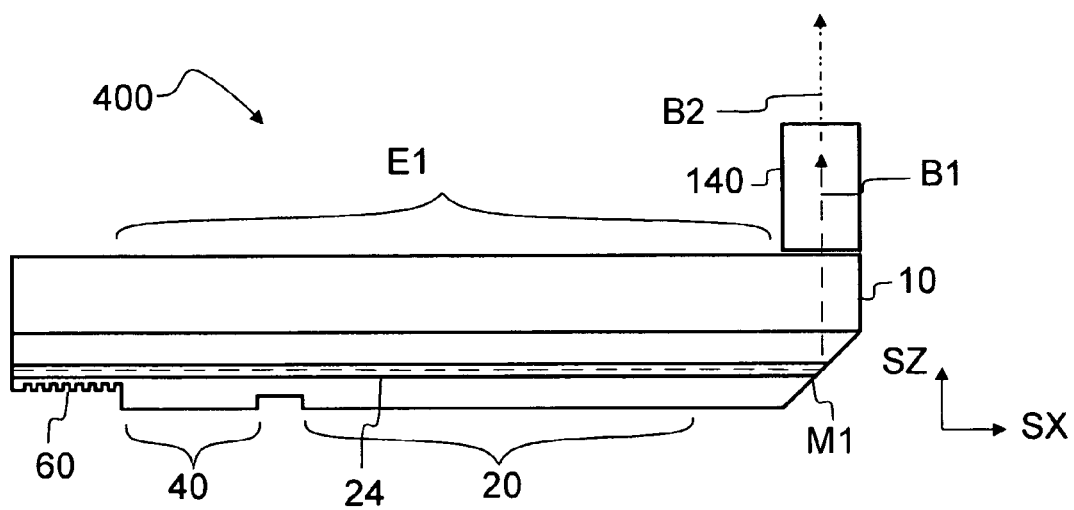
FIG. 2 shows, in a side view, a light-emitting device comprising a Bragg grating.

Referring to FIG. 2, the back reflector 60 may also be a Bragg grating implemented e.g. on the side of the waveguide 24.

When the light-emitting device 400 does not comprise a high-Q optical cavity, it may provide light pulses B1 by gain switching or by the varying intensity-dependent loss in the saturable absorber 40, i.e. by a process which is similar to the Q-switching. The "Q" denotes the quality factor. The absorber 40 is initially in the absorbing state for low-intensity light. The gain in the gain region 20 is temporarily reduced after emission of a preceding light pulse. The intensity transmitted through the absorber 40 increases with increasing intensity of the incident light, until the intensity reaches the saturation level of the absorber 40. The reflectance of the combination of the back reflector 60 and the saturable absorber 40 is now suddenly increased, which leads to a drastic increase in the intensity of light amplified in the gain region 20. However, generation of the high intensity reduces the gain in the gain region 20 due to spectral hole-burning effect, which provides the falling edge of the pulse. The saturable absorber 40 may have sufficiently short carrier lifetime to enable ultra-short pulses. The intensity is soon reduced below a level required to set the absorber into the absorbing state, and the cycle described above may repeat itself.

Figure 3:
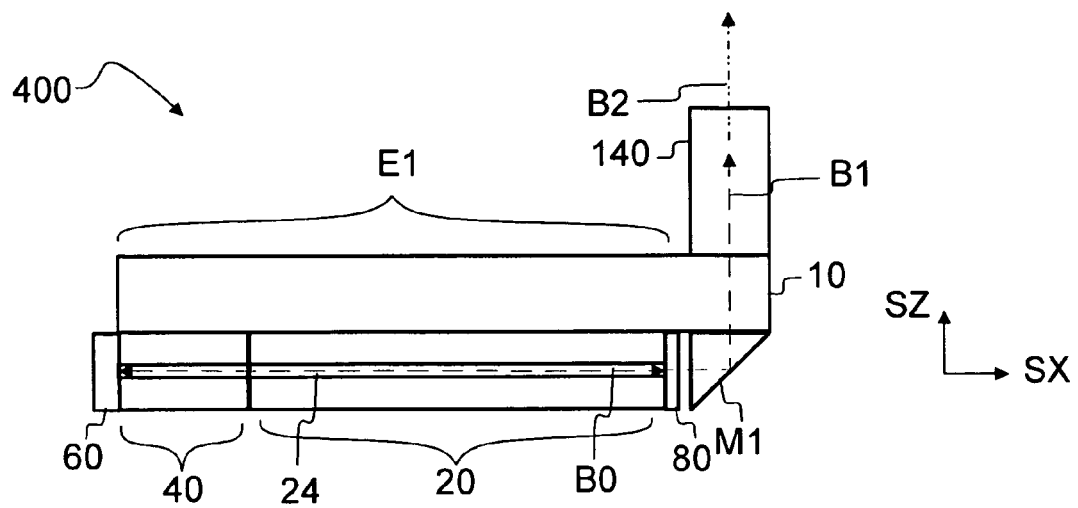
FIG. 3 shows, in a side view, a light-emitting device comprising an optical cavity defined by a back reflector and a partially reflecting structure.

Referring to FIG. 3, the light-emitting device 400 may further comprise an optical cavity, i.e. an optical resonator to control the properties of the light beam B1 and/or to enable wavelength-selective amplification of spontaneous emission. The optical cavity is defined by the back reflector 60 and a partially reflecting structure 80. The partially reflecting structure 80 may be e.g. between the gain region 20 and the inclined reflecting structure M1. The reflectivity of the partially reflecting structure 80 may be e.g. in the range of 3 to 70%. The partially reflecting structure 80 may be implemented e.g. by a cleaved end of the emitter E1, i.e. by using a reflecting interface between a solid and a gas. The cavity may be a Fabry-Perot cavity.

The optical cavity comprising the gain region 20 and the saturable absorber 40 may be adapted to provide light pulses B1 in the horizontal direction SX.

The saturable absorber 40 may be reverse biased. Saturable absorption in the saturable absorber may cause the emitted light beam B1 to pulsate at a frequency which may be, to the first approximation, inversely proportional to the optical length of the cavity.

When the light-emitting device 400 comprises an optical cavity, it may provide light pulses B1 by gain switching, by active mode-locking, by passive mode locking, by active Q-switching, by passive Q-switching, and/or by semi-passive Q-switching.

The device 400 may be set to Q-switched operation e.g. by selecting the reverse bias voltage of the saturable absorber 40 high enough, by selecting the optical length of the saturable absorber 40, by selecting the saturable optical absorption in the saturable absorber to be high enough, and/or by selecting the reflectivity of the front reflector 80 and/or the back reflector 60 to be low enough.

The inclined reflecting structure M1 may be adapted to provide very low optical feedback to the gain region 20, which allows operation of the gain region at a high bias current, while still maintaining pulsed operation of the light-emitting device 400.

In passive Q-switching, the bias voltage of the saturable absorber 40 is kept at a substantially constant level. In active Q-switching the optical loss in the saturable absorber 40 is modulated by modulating the bias voltage of the saturable absorber 40. Semi-passive Q-switching means that the bias voltage of the saturable absorber 40 is modulated in order to turn the laser on or off, but the a sequence of individual pulses is generated by passive Q-switching (see also FIGS. 29a to 29c).

In addition to the Q-switching, the drive current of the gain region 20 may be modulated even at a very high frequency in order to switch the lasing on or off.

It should be noticed that generation of light pulses by modulating the operating current of the gain region 20 without Q-switching provides a smaller efficiency of converting electrical power into light than by using the Q-switching. This is due to a non-linear relationship between the electrical power coupled into a laser emitter and the respective optical output. A higher bias current requires a higher voltage, which leads to a reduced efficiency. Optical power corresponding to a doubling of electrical input power is typically less than two times the optical power provided without said doubling.

The pulse repetition rate may be e.g. in the range of 100 MHz to 100 GHz. In particular, the pulse repetition rate may be in the range of 10 GHz to 100 GHz. The duration of the pulses may be in the order of 500 femtoseconds to 1 nanosecond (500 fs to 1 ns), while the energy of an individual light pulse may be kept smaller than 1 nJ (nanoJoule). Consequently, the peak power of an individual light pulse emitted from a single emitter E1 may be e.g. in the range of 0.5 W to 10 W.

The speed of the saturable absorber 40 and the gain region determine the minimum duration of a light pulse. In addition, the photon lifetime in the laser cavity has an effect on the pulse properties. For efficient frequency doubling, the light pulses should have a high intensity which may be achieved by short, high intensity pulses. The shorter the pulse width and the higher the pulse repetition rate, the lower is the speckle contrast perceived by a human eye. Especially in case of passive Q-switching, the phase of individual light pulses is substantially random, resulting in random interference between the pulses.

The integration time of the human eye is typically in the range of 10 ms. If the pulse repetition rate of a single emitter is e.g. 10 GHz, the human eye may receive up to 10 million speckle patterns formed by short coherence length pulses per the integration period of 10 ms. By further reducing the pulse width, by increasing the pulse repetition rate, and by using a plurality of independent emitters, the number of received speckle patterns may be even greater than $10^9$ per 10 ms with a substantially reduced speckle contrast.

A reduction in the duration of the pulse may also lead to an increase in the peak intensity, and consequently to a greater efficiency of converting electrical energy into the energy of visible light.

The recovery time of the saturable absorber 40 may be reduced e.g. by increasing the reverse bias voltage of the saturable absorber 40 or by introducing defects to the crystal by e.g. ion implantation.

The intra-cavity beam B0 may have a substantially greater intensity than the beam B1 transmitted through the partially reflecting structure 80.

The light-emitting device 400 may further comprise a phase shift region between the back reflector 60 and the partially reflecting structure 80 (not shown).

Figure 4:
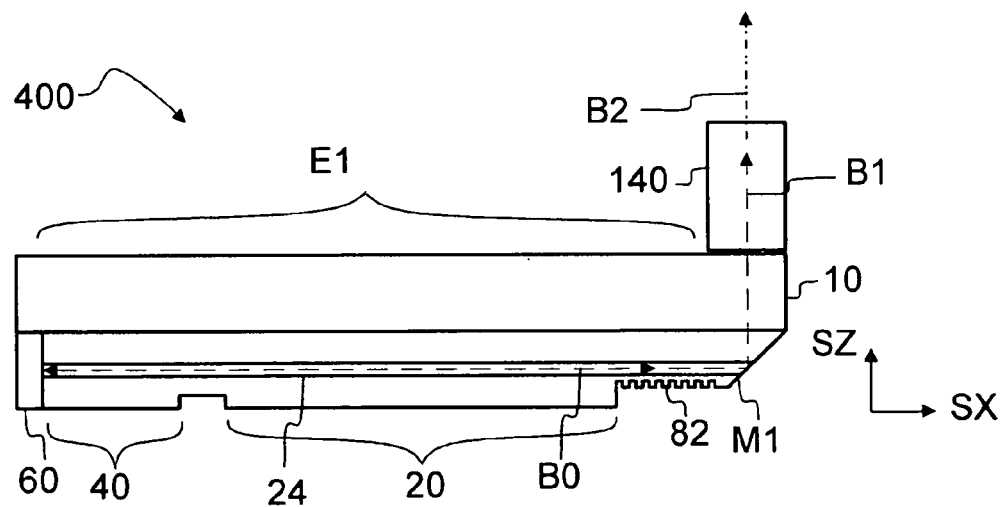
FIG. 4 shows, in a side view, a light-emitting device wherein the optical cavity is defined by the back reflector and a Bragg grating.

Referring to FIG. 4, the partially reflecting structure 80 may be a Bragg grating. Consequently, the emitter E1 may act as a distributed feedback (DFB) laser. The Bragg grating may be implemented e.g. on the side of the waveguide 24.

Figure 5:
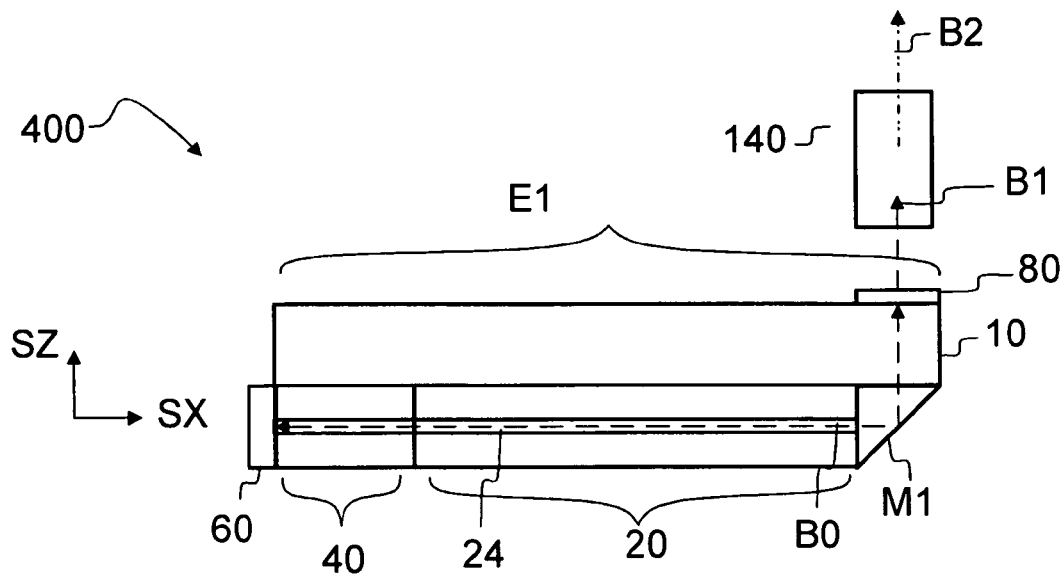
FIG. 5 shows, in a side view, a light-emitting device comprising a back reflector, an inclined reflecting structure, and a partially reflecting structure to define a folded optical cavity.

Referring to FIG. 5, the partially reflecting structure 80 may also be positioned after the inclined reflecting structure M1 in order to implement a folded cavity laser. In other words, the inclined reflecting structure M1 is optically between the gain region 20 and the partially reflecting structure 80. The partially reflecting structure 80 may be e.g. on the horizontal surface of the common substrate 10.

Figure 6:
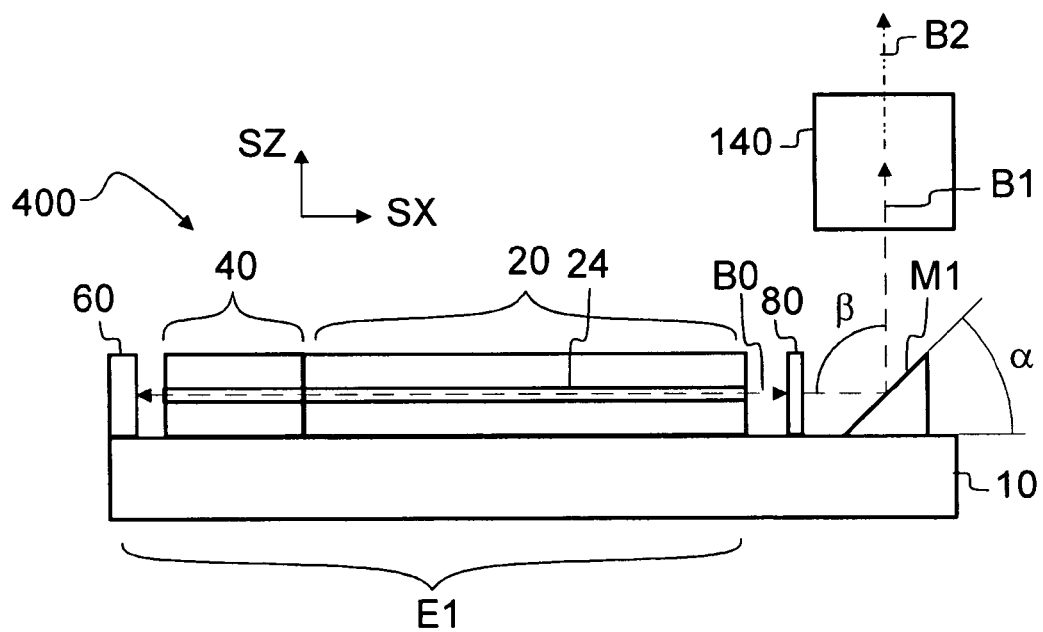
FIG. 6 shows, in a side view, a light-emitting device having an inclined reflecting structure to reflect light away from the common substrate.

Referring to FIG. 6, the inclined reflecting structure M1 may also be adapted to direct reflected light away in the direction SZ away from the common substrate 10. The common substrate does not need to be transparent in this embodiment.

Figure 7:
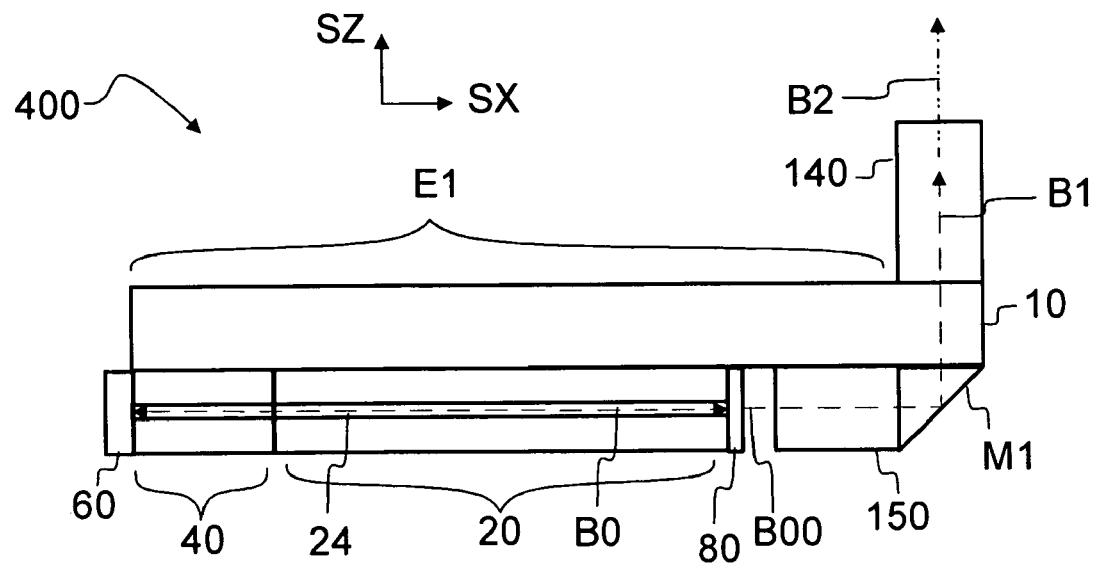
FIG. 7 shows, in a side view, a light-emitting device comprising a further gain region or a further gain module to amplify the output beam.

Referring to FIG. 7, the light-emitting device 400 may comprise a further gain region or a gain module 150. The further gain region 150 may provide a light beam B1 by amplifying a primary light beam B00 emitted from the end of the waveguide 24. The amplified light B1 may be subsequently coupled into the nonlinear crystal 140.

Figure 8:
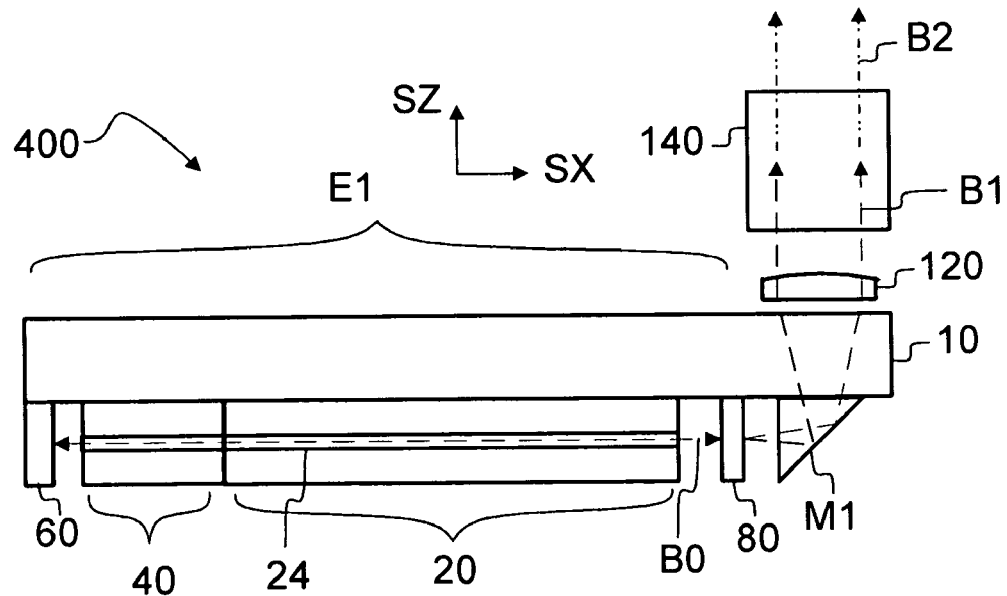
FIG. 8 shows, in a side view, a light-emitting device comprising a light-concentrating structure to focus or collimate light into a nonlinear crystal.

Referring to FIG. 8, the light-emitting device 400 may comprise a light-concentrating structure 120 to collimate or focus light B1 into the nonlinear crystal 140. The light-concentrating structure 120 may be a substantially cylindrical lens which is adapted to collimate or focus the light B1 in the direction of the fast axis, which is in the direction SX. The fast axis of the beam emitted from the waveguide 24 is originally in the direction SZ, but after the reflection by the structure M1, the fast axis is in the direction SX.

The light-concentrating structure 120 may be positioned between the common substrate 10 and the nonlinear crystal 140. For example, a lens 120 may be attached to the substrate 10 e.g. by optical cement.

The same lens 120 may also be adapted to collimate light B1 in the direction of the fast axis and the direction of the slow axis. The lens 120 may e.g. have an ellipsoidal surface, or a first surface of the lens 120 may have cylindrical curvature in the direction SZ and a second surface of the lens may have cylindrical curvature in the direction SY The direction SY is shown FIG. 13.

The light-concentrating structure 120 may also be a diffractive structure instead of or in addition to a lens in order to focus or collimate light B1 into the nonlinear crystal 140.

Figure 9:
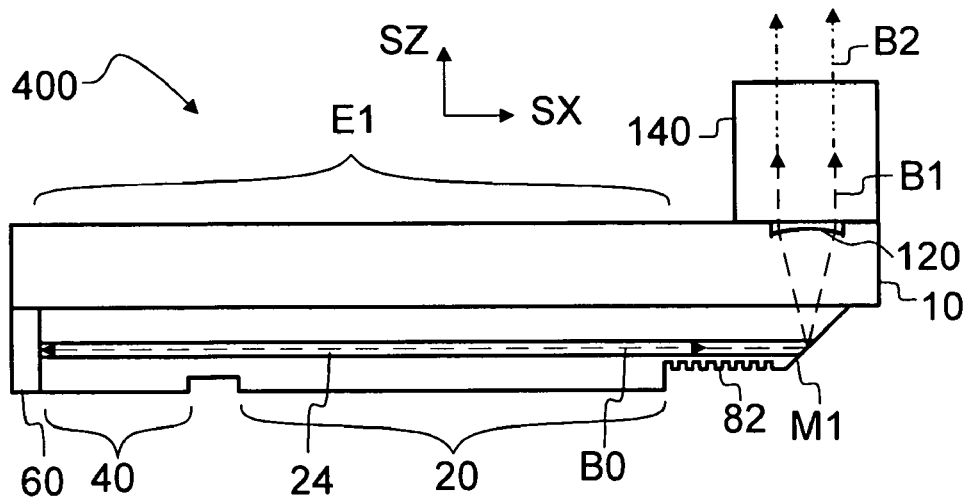
FIG. 9 shows, in a side view, a light-emitting device comprising a substrate which has a refractive surface to focus or collimate light into a nonlinear crystal.

Referring to FIG. 9, a portion of the surface of the substrate 10 may be substantially cylindrical in order to collimate or focus the beam B1 in the direction of the fast axis.

Thus, the use of the inclined reflecting structure M1 allows the use of an integrated cylindrical lens for efficient coupling of the light beam B1 into an attached nonlinear crystal 140, in particular into a waveguide 142 of an attached nonlinear crystal 140 (FIGS. 19*a*-20*c*, FIG. 21).

Figure 10:
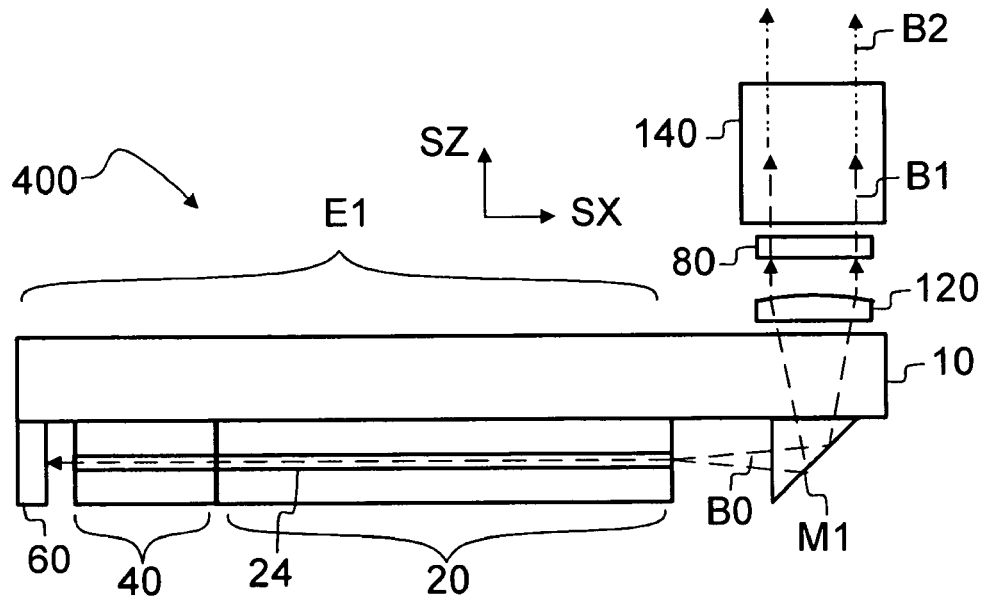
FIG. 10 shows, in a side view, a light-emitting device comprising a folded optical cavity and a light-concentrating structure.

Referring to FIG. 10, the partially reflecting structure 80 may also be positioned between the light-concentrating feature 120 and the nonlinear crystal 140 in order to define a folded laser cavity.

Also the upper surface of the substrate 10, the surface of the lens 120, or the surface of the nonlinear crystal 140 may be adapted to act as the partially reflecting structure 80. A dielectric coating may be applied to a surface to enhance reflection.

Figure 11:
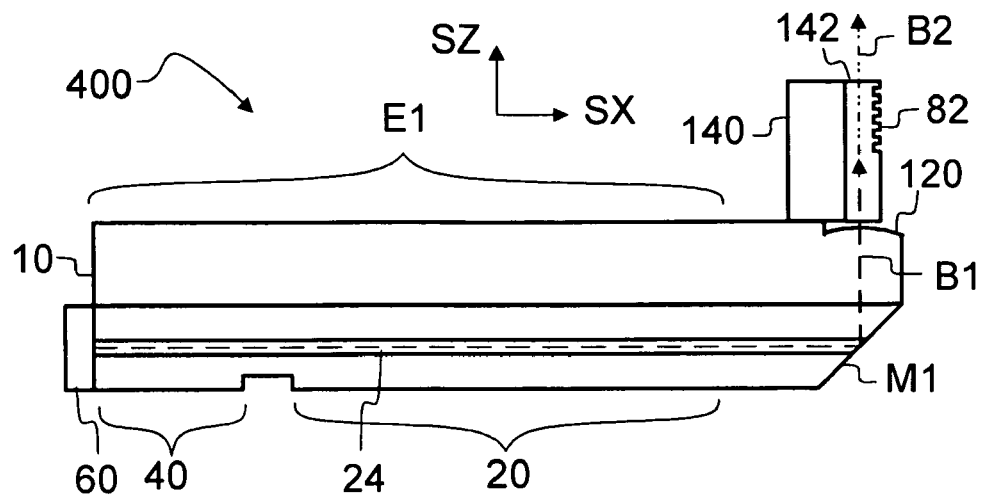
FIG. 11 shows, in a side view, a light-emitting device comprising a nonlinear crystal which has a Bragg grating to provide feedback to the gain region.

Referring to FIG. 11, the nonlinear crystal 140 may comprise a Bragg grating 82 to provide feedback to the gain region, e.g. to implement an optical cavity. The nonlinear crystal may also comprise a waveguide 142 to confine light and to improve the frequency conversion efficiency.

The speckle contrast may be minimized by reducing the duration of the light pulsed provided the emitter E1. The use of short light pulses provides also a good efficiency of converting electrical energy into optical energy at visible wavelengths. In particular, very short light pulses may be provided when the emitted high-intensity pulses travel through the gain region 20 only once. This may be achieved by e.g. by cavity dumping. The Bragg grating 82 may be adapted to provide frequency-selective feedback at the predetermined frequency of the fundamental light pulses B1, i.e. at the wavelength of said light pulses B1. The Bragg grating 82 may allow stabilization of the fundamental frequency and generation of light pulses by cavity dumping. Optical feedback provided by the combination of the nonlinear crystal 140 and the Bragg grating 82 is substantially smaller for the high-intensity light pulses than for the low-intensity light. Thanks to the intensity-dependent feedback, the fall time of the generated pulses may be very short. Consequently, very short and intense light pulses of visible light may be generated at a high efficiency.

The saturable absorber 40, the gain region 20, and the nonlinear medium are located optically between the back reflector 60 and the Bragg grating 82. The saturable absorber 40 and the gain region 20 are adapted to emit the first light pulses B1 which are coupled into said nonlinear medium to generate the second light pulses B2. The gain region 20 emits also low-intensity light by amplified spontaneous emission such that said low-intensity light has a substantially lower intensity than said first light pulses. The low-intensity light is coupled through said nonlinear medium to said Bragg grating 82 such that the grating 82 is adapted to reflect light frequency-selectively back into the gain medium 20 in order to stabilize the optical frequency of said first light pulses B1.

The reflectivity of the combination of the Bragg grating 82 and the nonlinear crystal 140 may be high at low intensity values and at the fundamental frequency, which amplifies light at the fundamental frequency. At higher intensities, the energy of the light pulses B1 at the fundamental frequency may be converted in a single-pass process into the energy of the light pulses B2 at the second harmonic frequency. The single-pass conversion efficiency may be even greater than 80% in a waveguide 142 which comprises nonlinear medium. Conversion of fundamental light B1 into second harmonic light B2 at high intensities reduces the reflectivity of the combination of the Bragg grating 82 and the nonlinear crystal 140 and causes cavity dumping.

The Bragg grating 82 may be implemented on the side of the waveguide 142 or in the waveguide 142. The dispersion of the waveguide 142 and the grating period of the Bragg grating 82 may be selected such that the reflectivity of said Bragg grating 82 is substantially higher for the first light pulses B1 than for the second light pulses B2. In other words, the Bragg grating 82 may be substantially transmitting for the second light pulses B2.

The waveguide 142 may also comprise a cladding layer which has a lower refractive index than a core of said waveguide 142. The Bragg grating may be implemented on said cladding. The distance between the core of said waveguide and the diffractive features of the Bragg grating 82 may be selected such that that the reflectivity of the Bragg grating 82 is substantially higher for the first light pulses B1 than for the second light pulses B2.

Figure 12:
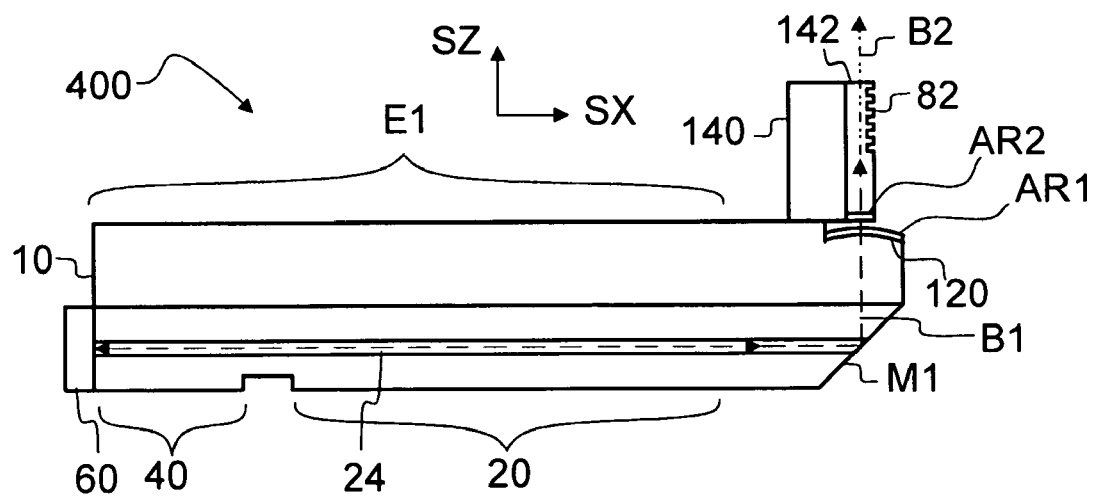
FIG. 12 shows, in a side view, a light-emitting device having antireflection-coated solid-gas interfaces.

Referring to FIG. 12, unwanted reflections from solid-gas interfaces in the cavity may be further reduced by implementing antireflection coatings AR1, AR2. The surface of the common substrate 10, the surface of the lens 120 and/or the nonlinear crystal 140 may have anti-reflection coatings AR1, AR2 in order to minimize broadband feedback to the gain region 20 and in order to maximize peak optical power of the light beam B1. An advantage gained by using the inclined reflecting structure M1 is that antireflection coatings AR1, AR2 may be more easily applied to the substrate 10, lens 120 and/or the crystal 140, than to the end of the waveguide 24 of the emitter E1.

Figure 13:
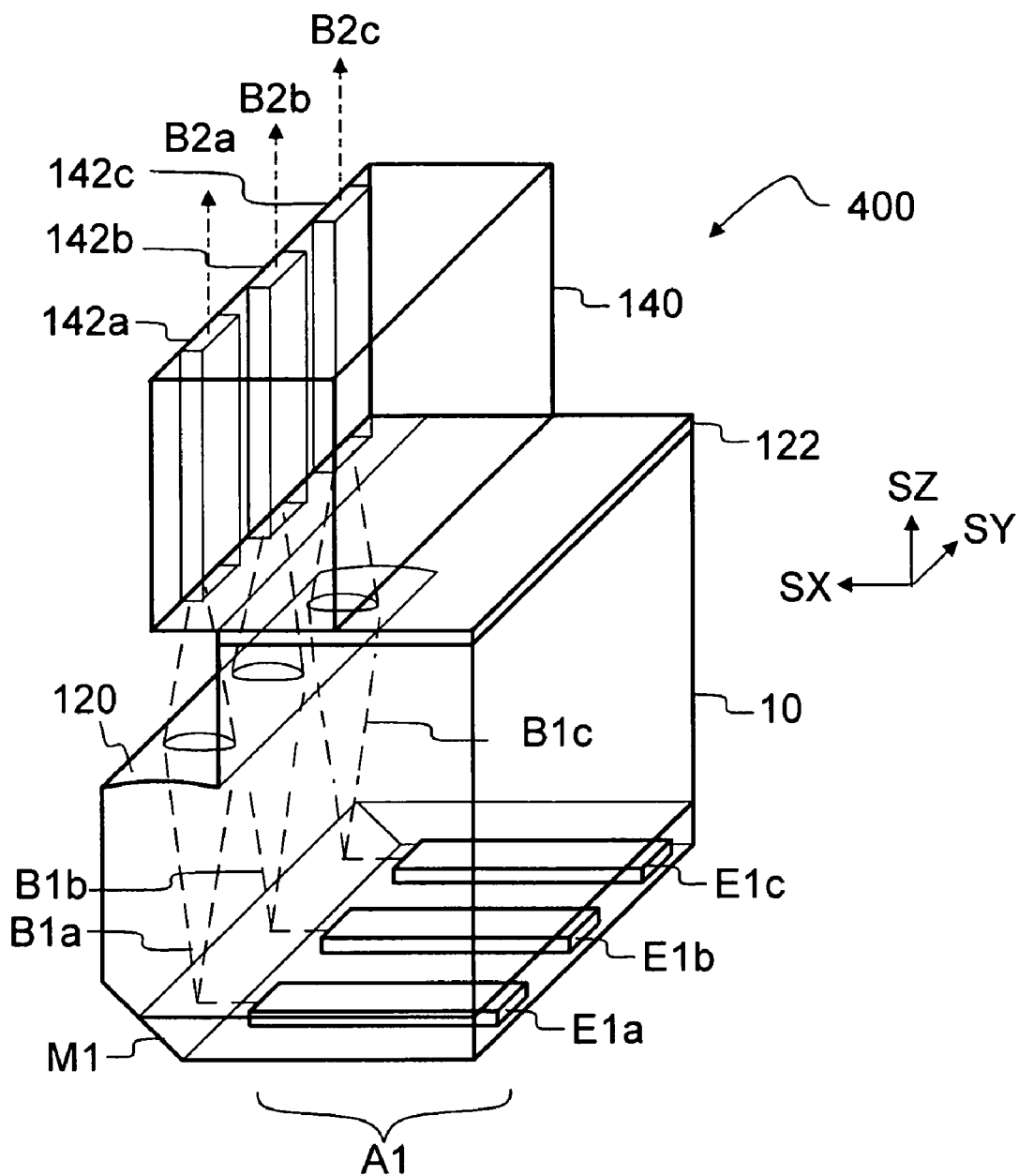
FIG. 13 shows, in a three-dimensional view, a light-emitting device comprising an array of adjacent laser emitters, an inclined reflecting structure, and a common cylindrical surface to collimate or focus light in the direction of the fast axis into the nonlinear crystal.

Referring to FIG. 13, the light emitting device 400 may comprise a plurality of adjacent laser emitters E1*a*, E1*b*, E1*c* arranged as an array A1 on the substrate 10. The waveguides 24 of the emitters E1a, E1b, E1c of an array A1 are substantially parallel to each other. The array A1 may comprise two or more laser emitters E1 as described above with reference to FIGS. 1 to 12.

The direction SY is perpendicular to the directions SX and SZ.

The number of the emitters in the array A1 may be e.g. in the range of 2 to 5. The number of the emitters may also be in the range of 6 to 50 in order to provide high power and/or low speckle contrast. The number of the emitters may even be in the range of 51 to 2000 to implement a very low speckle contrast and a high luminous flux.

The distance between the centerlines of the emitters may be e.g. in the order of 25-100 µm. A 2.5 mm wide array A1 may comprise e.g. 25 to 100 individual emitters E1a, E1b, E1c, respectively. The centerlines may be substantially in the same plane.

The light provided by the emitters E1a, E1b, E1c of the array A1 may be reflected by a common inclined reflecting structure M1 and collimated or focused by a common light-concentrating feature 120 into a common nonlinear crystal 140. The light-concentrating feature 120 may be a substantially cylindrical lens 120 adapted to collimate or focus light in the direction of the fast axis, i.e. in the direction SX.

The nonlinear crystal 140 may comprise one or more waveguides 142a, 142b, 142c to confine the in-coupled light. Said waveguides 142a, 142b, 142c comprise nonlinear medium. The purpose of said waveguides is to preserve a high intensity along the length of crystal, i.e. in the vertical direction SZ, for more efficient single-pass frequency doubling.

The height of the waveguides 142a, 142b, 142c may be e.g. 5 µm and the width may be e.g. 7 µm. Said height (in direction SX) and width (in direction SY) are perpendicular to the propagation direction SZ of the beam B1 in the waveguides 142a, 142b, 142c.

The waveguides 142a, 142b, 142 may be implemented on the side of the nonlinear crystal 140 e.g. by annealed-proton-exchange (APE) or by diffusion, e.g. by zinc or titanium diffusion.

A plurality of adjacent parallel waveguides 142a, 142b, 142c may provide a plurality of adjacent frequency-doubled light beams B2a, B2c, B2c, etc.

The size of the beam B1 impinging on the waveguides 142a, 142b, 142c may be minimized by minimizing the optical distance between the light-concentrating structure 120 and the waveguides 142a, 142b, 142c, which in turn may be accomplished by minimizing the focal length of said light-concentrating structure 120. The input end of each waveguide 142a, 142b, 142c may be positioned at the waist of the light beam focused or collimated by the light-concentrating structure 120. The waveguides 24 of the emitters E1a, E1b, E1c may be designed such that the divergence of the beams B1a, B1b, B1c is minimized.

The light emitting device 400 may also comprise further cylindrical surfaces or lenses (FIG. 18) to collimate or focus the light beams B1 also in the direction SY of the slow axis. The nonlinear crystal 140 may comprise a plurality of non-planar facets 124a, 124b, 124c to collimate or focus the light beams B1 in the direction SY of the slow axis (FIGS. 19a and 19b).

The nonlinear crystal 140 may also have diffractive structures to focus or collimate light B1 and/or B2.

The nonlinear crystal 140 may be attached to the substrate 10 by a spacer 122. The position of the crystal may be set e.g. by selecting the thickness of the spacer 122.

Figure 14:
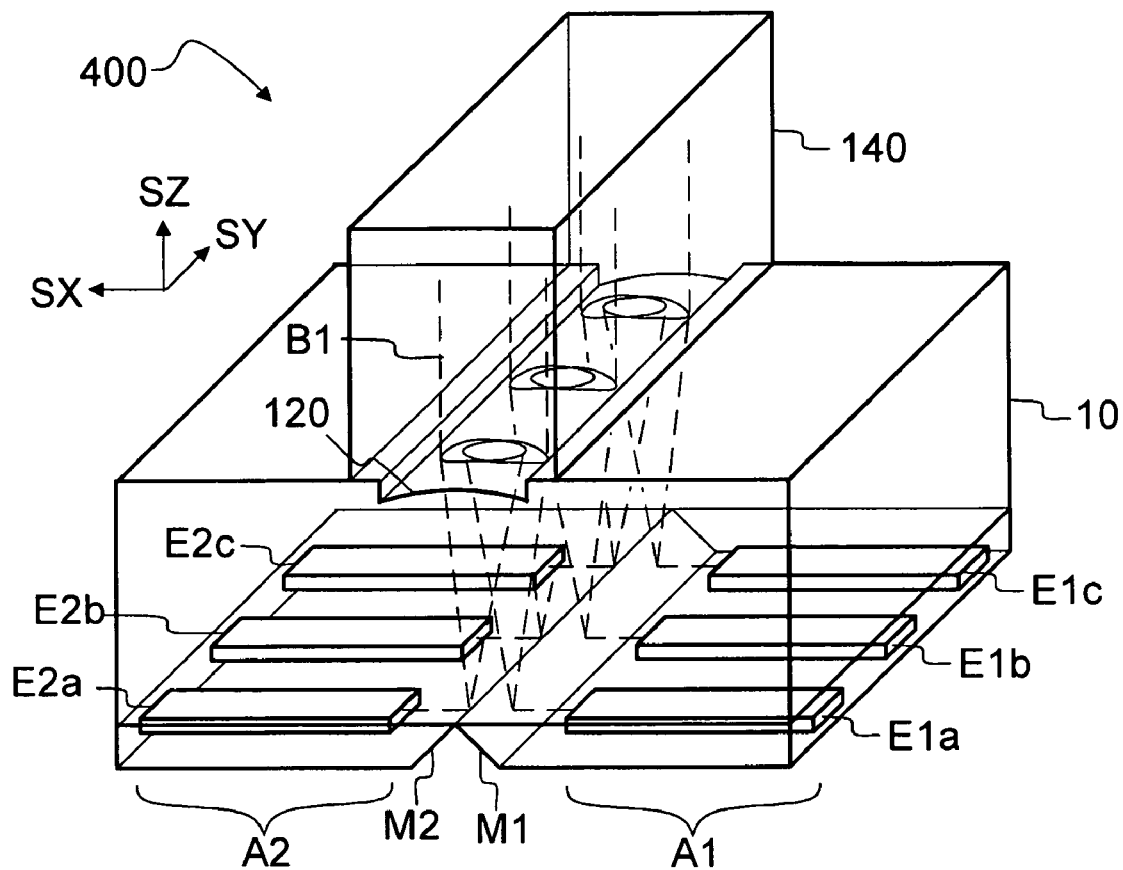
FIG. 14 shows, in a three-dimensional view, a light-emitting device comprising two opposite arrays of emitters.

Referring to FIG. 14, the light-emitting device 400 may comprise two opposite emitter arrays A1, A2 to increase power and/or to further reduce speckle contrast. The opposite arrays A1, A2 may be implemented on the common substrate 10. The light provided by the emitters E1a, E1b, E1c of the array A1 and the emitters E2a, E2b, E2c of the array A2 may be collimated by a common cylindrical lens 120 into a common nonlinear crystal 140. The lens 120 may be adapted to collimate or focus light in the direction of the fast axis, i.e. in the direction SX. The light beams provided by the array A1 may be reflected by the inclined reflecting structure M1 and the light beams provided by the array A2 may be reflected by a second inclined reflecting structure M2. The emitters E1a, E1b, E1c, E2a, E2b, E2c may be as described above with reference to FIGS. 1 to 13. The emitters of the arrays A1, A2 may be substantially similar.

The emitters E1a, E1b, E1c, E2a, E2b, E2c may be implemented substantially simultaneously on the common substrate 10 by using known semiconductor processing technologies.

The beams provided by the different emitters E1a, E1b, E1c, E2a, E2b, E2c may be adapted to remain substantially separate in the nonlinear crystal 140.

Figure 15:
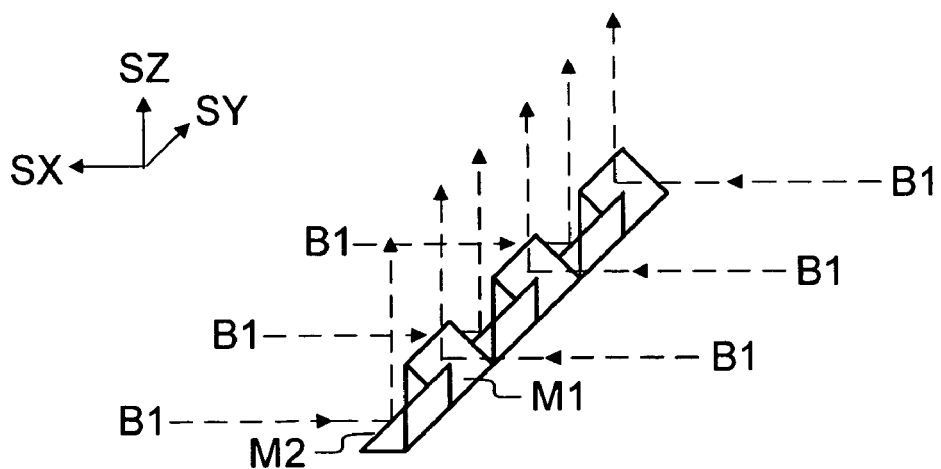
FIG. 15 shows, in a three-dimensional view, a plurality of interlaced inclined reflecting structures adapted to provide a plurality of light beams which are in the same vertical plane.

Referring to FIG. 15, the inclined reflecting structures M1, M2 may be interlaced such that the reflected light beams B1 are substantially in the same vertical plane defined by the directions SY and SZ.

Figure 16:
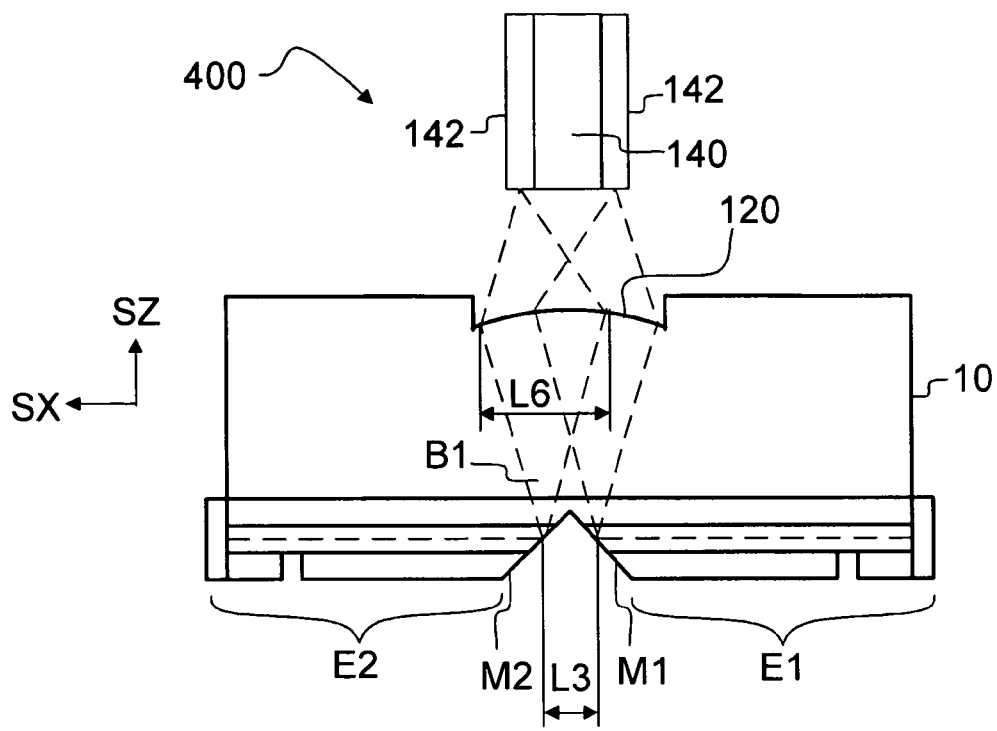
FIG. 16 shows, in a side view, a light-emitting device comprising opposite emitters and inclined reflecting structures to reflect light through the common substrate into a nonlinear crystal.

Referring to FIG. 16, a first emitter E1 and a second emitter E2 may be implemented on the common substrate 10 such that the second emitter E2 is substantially opposite the first emitter E1. The light beams provided by the emitters E1, E2 may be reflected by the reflecting structures M1, M2 through the substrate 10. The beams B1 may be collimated by a common lens 120 into a common nonlinear crystal 140. The nonlinear crystal 140 may have light-confining waveguides 142 on both sides of the crystal 140 as shown in FIG. 16. The beams B1 from the opposite emitters E1, E2 may also be concentrated to a common waveguide 142 on one surface of the crystal 140.

The distance L3 between reflection points of the vertical beams B1 may be e.g. in the range of 3-15 µm. Due to the fast-axis divergence, the width L6 of the beams B1 may be in the range of 15 to 80 µm at the upper surface of the substrate 10.

Figure 17:
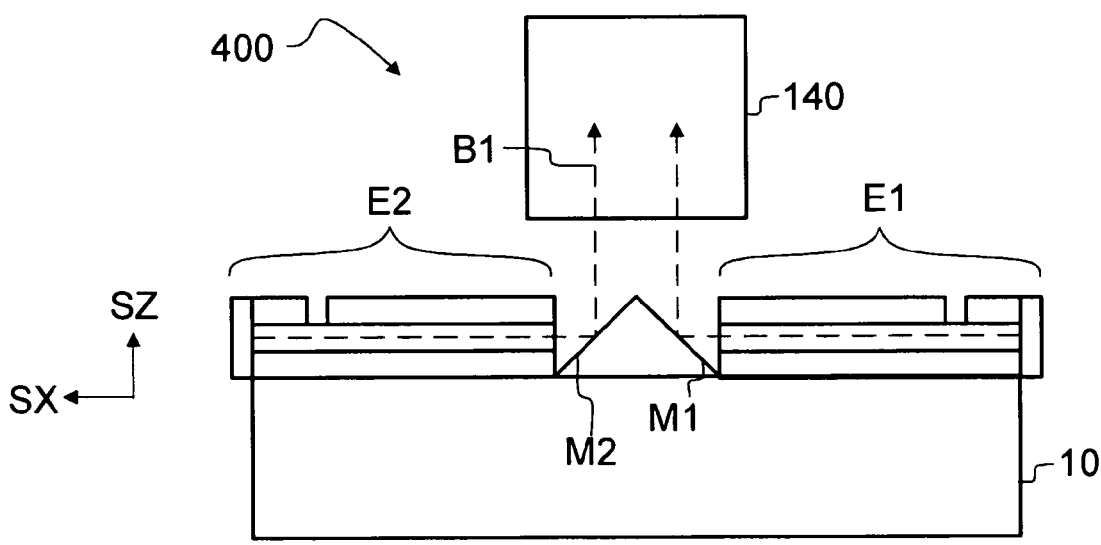
FIG. 17 shows, in a side view, opposite emitters and inclined reflecting structures to reflect light away from the common substrate into a nonlinear crystal.

Referring to FIG. 17, the reflecting structures M1, M2 may be adapted to reflect the light beams B1 provided by the emitters E1, E2 away from the substrate 10 into a common nonlinear crystal 140.

Figure 18:
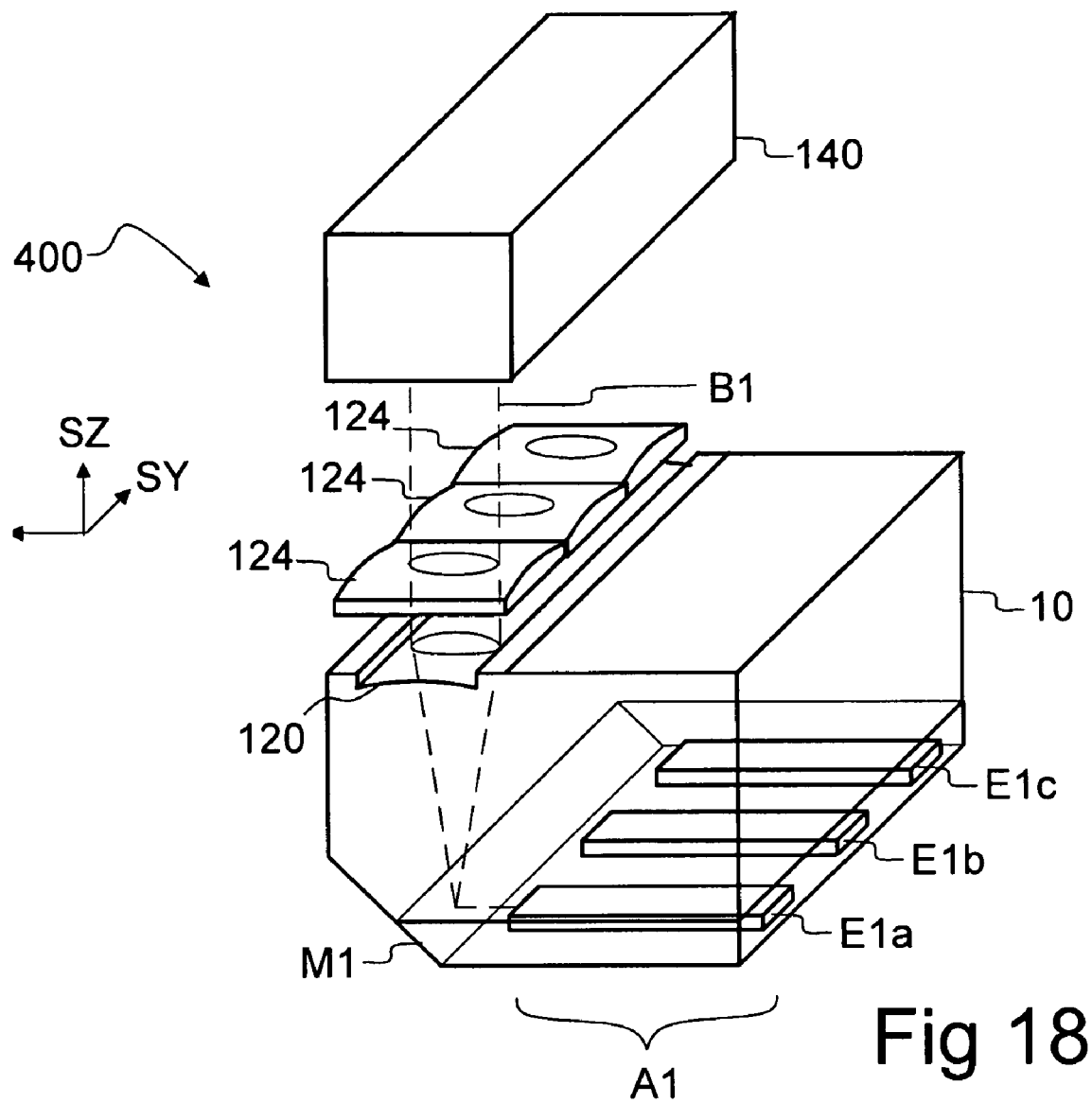
FIG. 18 shows, in a three-dimensional view, a light-emitting device comprising a plurality of cylindrical refractive surfaces to focus or collimate light in the direction of the slow axis into the nonlinear crystal.
Figure 19A:
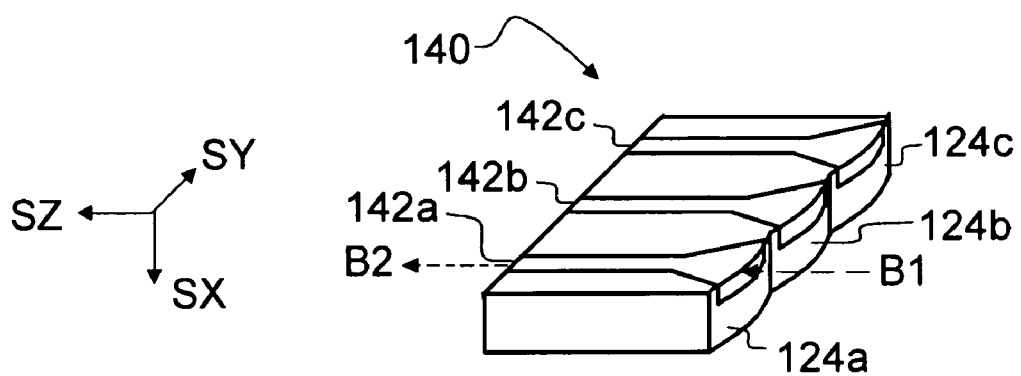
FIG. 19a shows, in a three-dimensional view, a nonlinear crystal having a plurality of waveguides, each of said waveguides having a tapered input portion and a non-planar input facet in order to focus light into a narrow portion of said waveguide.
Figure 19B:
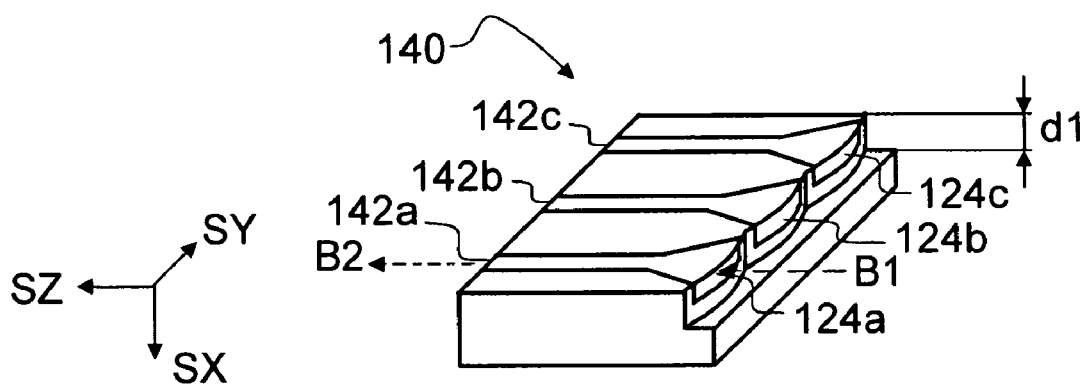
FIG. 19b shows, in a three-dimensional view, a nonlinear crystal having etched facets.

Referring to FIG. 18, the light-emitting device 400 may comprise further cylindrical lenses or surfaces 124 to collimate or focus light in the direction of the slow axis.

Referring to FIG. 19a, the input end of the waveguides 142a, 142b, 142c of the nonlinear crystal 140 may have a tapered portion to collect light into the narrow portion of the waveguides 142a, 142b, 142c. The input end of the waveguide 142a, 142b, 142c may have a non-planar facet to refract light in order to collect light into the narrow portion of the waveguides 142a, 142b, 142c. Also the output end of the waveguides 142a, 142b, 142c may have tapered portion and/or facets.

The non-planar facets may have e.g. a convex or concave form. The nonlinear crystal may have e.g. a plurality of substantially cylindrical surfaces 124a, 124b, 124c to focus or collimate light into a plurality of waveguides 142a, 142b, 142c. Consequently, the coupling efficiency of the light B1 may be improved and/or the divergence of the second-harmonic light B2 may be reduced.

Referring to FIG. 19b, the non-planar facets may be formed e.g. by etching on the surface of the nonlinear crystal 140. The etching may be done only near the surface of the nonlinear crystal 140. The etching depth d1 may be e.g. 20 μm.

Figures 20A, 20B:
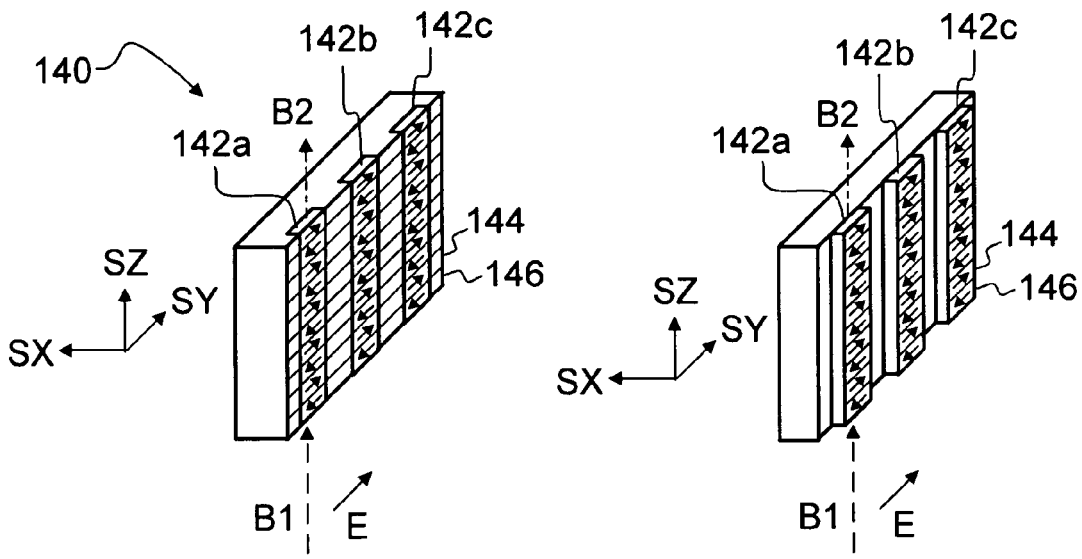
FIG. 20a shows, in a three-dimensional view, a periodically poled nonlinear crystal for TE-polarized light.
FIG. 20b shows, in a three-dimensional view, a periodically poled nonlinear crystal for TE-polarized light, said crystal comprising ridge waveguides.

Referring to FIGS. 20*a* and 20*b*, the nonlinear crystal 140 may be periodically poled in the direction SY, i.e. along the surface of the nonlinear crystal 140, in order to provide quasi-phase-matching conditions. The crystal 140 may comprise ferroelectric material poled by a spatially periodic electric field. Consequently, the nonlinear crystal 140 may comprise regularly spaced poled domains 144, 146 whose direction is matched with the electric field E of the second harmonic beam B2. The quasi-phase-matching grating may also be chirped or patterned in order to compress and/or modify the shape of the light pulses. The electric field E of the incoming laser beam may be substantially parallel to the direction SY. The period of the poled domains is selected in such a way that the phase of the generated second harmonic beam B2 is matched with the fundamental light B1 in each poling period. Said selection is based on the dispersion of the nonlinear medium, i.e. on the difference between the refractive index of the fundamental light B1 and the second harmonic light B2.

A periodically poled nonlinear crystal 140 may have one or more waveguides 142, 142*a*, 142*b*, 142*c*. The waveguides may be formed on one or both sides of the nonlinear crystal 140 (see FIG. 16).

A single nonlinear crystal 140 may have several periodically poled zones whose periods are optimized for several different fundamental frequencies. Thus, a single nonlinear crystal 140 may be adapted to provide e.g. red, green and blue light.

The nonlinear crystal or medium 140 may be e.g. lithium niobate, lithium tantalite, or potassium titanyl phosphate (KTiOPO4) which is also known as the KTP, periodically poled KTP, periodically poled lithium niobate (PPLN), lithium triborate (LBO). In particular, the nonlinear crystal 140 may be periodically poled magnesium oxide-doped lithium niobate (PP-MGO-LN).

The light-emitting device 400 may comprise one or more nonlinear crystals 140.

The nonlinear crystal 140 may also be without a waveguide and the poled domains.

Referring to FIG. 20*b*, the waveguides 142*a*, 142*b*, 142*c* of the nonlinear crystal may be ridge waveguides, which may be implemented e.g. by etching.

Figure 20C:
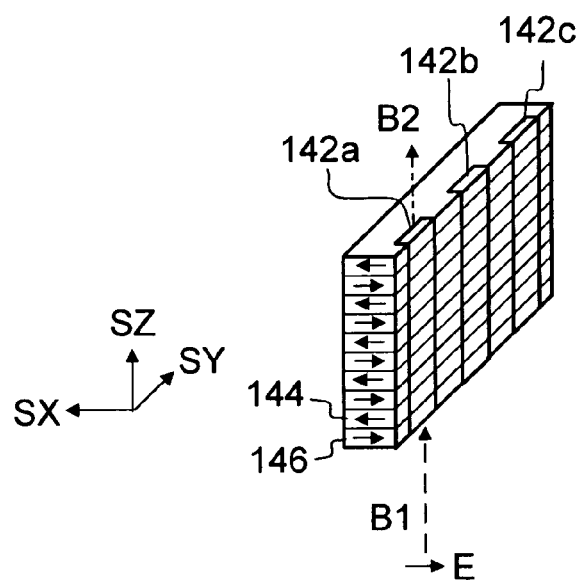
FIG. 20c shows, in a three-dimensional view, a periodically poled nonlinear crystal for TM-polarized light.

Referring to FIG. 20*c*, the nonlinear crystal may also be poled in the direction SX, i.e. substantially perpendicular to the surface of the crystal 140.

Referring to FIG. 12 and FIGS. 19*a* to 20*c*, the nonlinear crystal 140 may comprise one or more of the following features:
- a waveguide 142*a*, 142*b*, 142*c* to confine light,
- a Bragg grating to provide frequency-selective feedback through nonlinear medium,
- a tapered inlet/outlet portion of a waveguide to facilitate focusing or collimating,
- a non-planar facet or a diffractive structure to refract light in order to facilitate focusing or collimating, and
- periodically poled zones 144, 146.

In particular, the nonlinear crystal may comprise a waveguide, a Bragg grating, periodically poled zones, and a tapered inlet portion.

Figure 21:
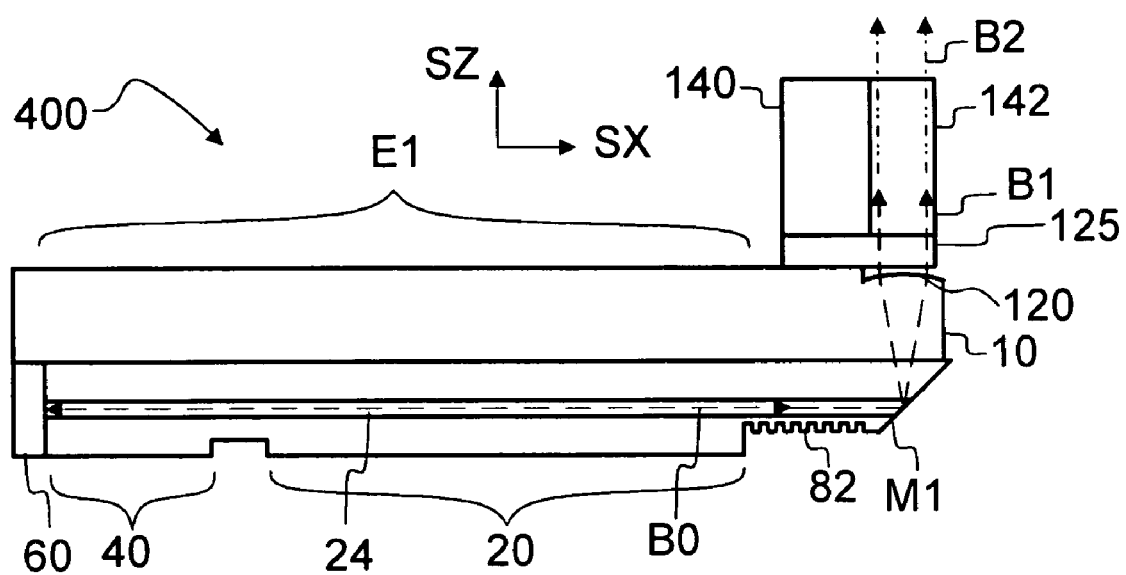
FIG. 21 shows, in a side view, a light-emitting device comprising a polarization-rotating element.

Referring to FIG. 21, the light-emitting device 400 may comprise a polarization rotating element 125 which is positioned between the emitter E1 and the nonlinear crystal 140, i.e. between the waveguide 24 of an emitter E1 and the nonlinear crystal 140. The polarization rotating element 125 may rotate the polarization of the light beam B1 emitted from the waveguide 24 such that the light coupled into the nonlinear crystal 140 has optimum polarization with respect to orientation of the poled zones 144 146. The polarization rotating element 125 may rotate polarization e.g. by 90 degrees. The polarization rotating element may be e.g. a half-waveplate.

Figure 22A:
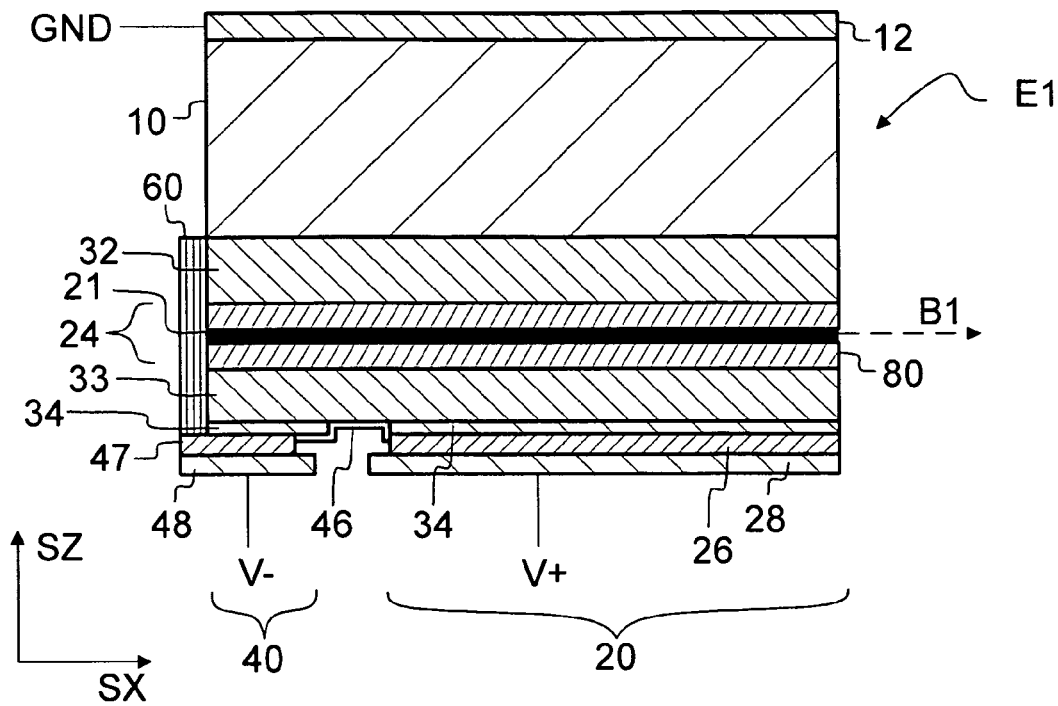
FIG. 22a shows, in a side view, structural layers of a laser emitter.

FIG. 22*a* shows, by way of example, structural layers of an edge-emitting laser emitter E1. The waveguide 24 comprises at least one active region 21, e.g. one or more quantum wells. In particular, the active region 21 may comprise quantum dots or three quantum wells. The waveguide 24 is substantially parallel to the structural layers of the active region 21, and the light beam B1 propagates along said active region. For comparison, a light beam provided by a vertical cavity surface-emitting laser (VCSEL) is typically substantially perpendicular to structural layers of said VCSEL. An advantage gained by using the edge-emitting configuration is the substantially higher single-pass gain. The amount saturable absorption may also be selected by selecting the length of the saturable absorber 40 without the implementation of further structural layers. Consequently, the saturable absorber 40 may be adapted to provide a high saturable absorption without increased manufacturing costs.

The common substrate 10 may be of a substantially transparent semiconductor material, e.g. gallium arsenide (GaAs) or Indium phosphide (InP).

The waveguide 24 is located between cladding layers 32, 33. The substrate side cladding 32 may be n-doped and the second cladding 33 may be p-doped. A contact layer 34 is grown on the p-doped cladding. The gain region 20 and the saturable absorber have separate metallic contacts 26, 47. The laser chip, i.e. the emitter E1 may be attached to an insulated patterned submount with e.g. Au/AuSn solder pads 48, 28.

The upper side of the common substrate 10 may be coated with a metallic contact layer 12. The back-reflector 60 may be implemented by optical multilayer coatings.

The waveguide 24 is substantially parallel to the common substrate 10. The waveguide 24 comprises the gain region 20 and the saturable absorber 40.

The layers 48, 28 may be in contact with an electrically insulating submount (not shown) in order to cool the device 400. The submount may also be electrically conducting if the saturable absorber 40 has a contact pad 28 which is electrically insulated from the submount. The submount may be made of e.g. beryllium oxide, silicon carbide, or diamond. The layers 48 and 28 may be pre-deposited on said submount. The submount may be in contact with a heatsink (not shown) in order to cool the device 400.

Alternatively, the layer 12 may be in contact with a submount. However, the cooling is less effective than in case of cooling through the layers 28, 48, due to the greater thermal resistance through the common substrate 10

The gain region 20 is electrically pumped. A positive bias voltage V+ may be coupled to the gain region 20, and a negative bias voltage V− may be coupled to the saturable absorber 40, with respect to the ground GND. In other words, the gain region 20 if forward biased, and the saturable absorber 40 is reverse-biased.

There may be an electrical insulator 46 between the saturable absorber 40 and the gain region 20. The insulator may be e.g. a layer of silicon dioxide $SiO_2$. The highly doped contact layer 34 may be locally etched away from below the insulator 46 such that the resistance between the gain region 20 and the saturable absorber 40 may be higher than e.g. 1 kΩ. The resistance between the gain region 20 and the saturable absorber 40 may be increased e.g. by ion implantation. The highly doped contact layer 34 may extend below the insulator 46 in order to maximize the effective length of the saturable absorber 40, by distributing electrical current also in the horizontal direction, while still providing a sufficient separation of the two metal contacts 26, 47 in order to facilitate packaging.

Figure 22B:
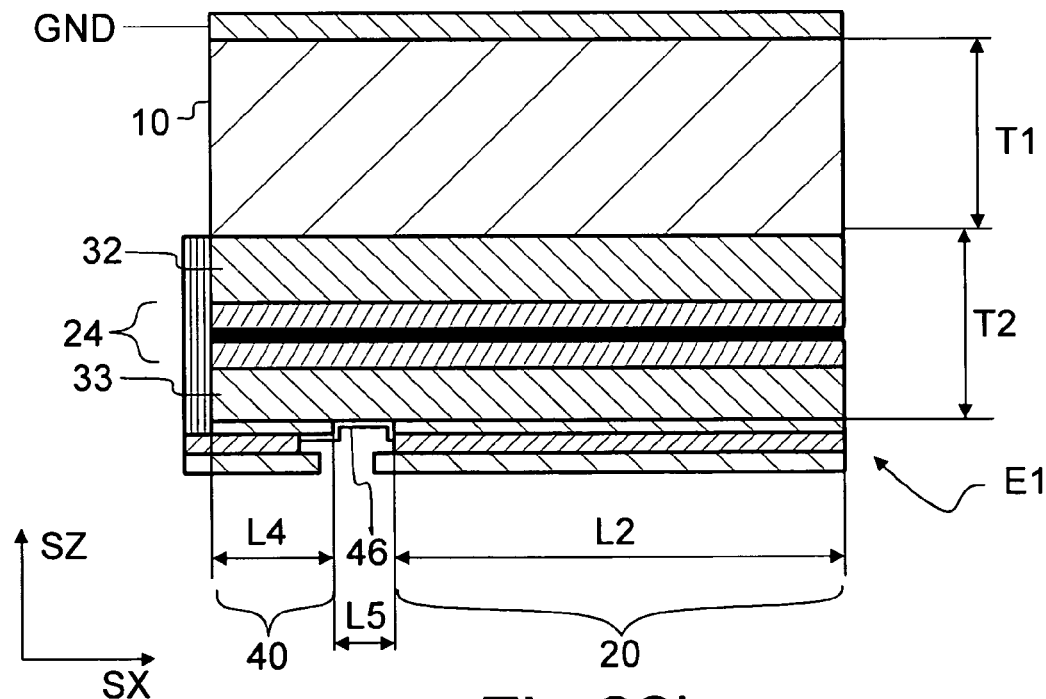
FIG. 22b shows, in a side view, dimensions associated with the emitter of FIG. 22a, FIG. 23 shows, in a three-dimensional view, a laser emitter having a ridge waveguide.

FIG. 22b shows some dimensions associated with the structure of FIG. 22a. The total thickness T2 of the waveguide and the cladding layers 32, 33 may be e.g. in the range of 3 to 4 μm. The thickness of the common substrate 10 may be e.g. in the range of 80 to 150 μm. The length L5 of the insulating zone between the saturable absorber 40 and the gain region 20 may be e.g. in the range of 5 to 50 μm. The length L2 of the gain region 20 may be e.g. in the range of 250 to 4000 μm. The length L4 of the saturable absorber may be e.g. in the range of 10 to 200 μm.

Referring to FIG. 23, the laser emitter E1 may comprise a ridge waveguide 24. The waveguide 24 comprises the gain region 20, and it may further comprise the saturable absorber 40. The gain region 20 and the saturable absorber 40 may be implemented on the common substrate 10.

The electric field in the gain region 20 is substantially oriented in the direction SZ. Said electric field is caused by the bias voltage V+. Properties of the gain region 20 determine the polarization of the fundamental light B1. The polarization of the fundamental light B1 emitted from the end of the waveguide 24 may be substantially parallel to the direction SZ or parallel to the direction SY.

Edge-emitting lasers with a lattice-mismatched gain region 20 have a stable polarization determined by the device asymmetry and the strain of the gain region 20. The stable polarization allow effective use of a periodically poled nonlinear crystal. For comparison, vertical cavity surface emitting lasers have typically an unstable polarization due to high device symmetry.

A laser array A1 may comprise several parallel ridge waveguides 24 according to FIG. 23. Contact layers 26, 47 of adjacent emitters E1 may be attached to a common heat sink. The light-emitting device 400 may have grooves 41 which are etched into the cladding layer 33 in order to define a ridge waveguide 24. The cladding 33 and the grooves may be coated with electrically insulating layers 15. The insulating layer 15 may be locally removed and the electrical contacts 26, 47 may be implemented on the exposed cladding 33 over the central portions of the ridge waveguide 24.

The waveguide 24 may also have a tapered form in order to reduce the divergence of the emitted light beam B1 in the direction of slow axis.

Referring to FIG. 24, the inclined reflecting structure M1 may be implemented by an interface between the waveguide 24 and a dielectric layer 92, i.e. the reflection may take place by total internal reflection (TIR). The dielectric layer 92 may be e.g. silicon nitride $Si_3N_4$ or silicon dioxide $SiO_2$. The dielectric layer 92 may be protected by a further metal layer 94, e.g. by a layer of gold.

An advantage associated with the inclined reflecting structure M1 of FIG. 24 a is that a high intensity at the output surface of the laser emitter E1 may be avoided due to beam divergence in the substrate 10. The reduction in the intensity decreases the risk of catastrophic optical damage (COD) at the output interface. The inclined reflecting structure M1 may also be cooled by a further metallic layer to the submount (not shown), which further reduces the risk of COD. The inclined reflecting structure M1 also allows the integration of the cylindrical lens surface 120 into the common substrate 10 for efficient coupling of the fundamental beam B1 into the nonlinear crystal 140.

The structure may be implemented without any solid-gas interfaces between the gain region 20 and the surface of the substrate 10. A portion 120 of the surface of the common substrate 10 may have a substantially cylindrical form to collimate or focus the beam B1 into the nonlinear crystal 140.

The other structural layers shown in FIG. 24 were described above with reference to FIG. 22a, FIG. 22b and FIG. 23.

The inclined reflecting surface M1 may further comprise a diffractive grating in order to reflect a part of the light beam B1 back into the waveguide 24, in addition to reflecting a part of the light beam into the nonlinear crystal 140. Thus, the inclined reflecting surface M1 may also act as the partially reflecting structure 80 (FIG. 3) which defines an optical cavity.

Figure 25:
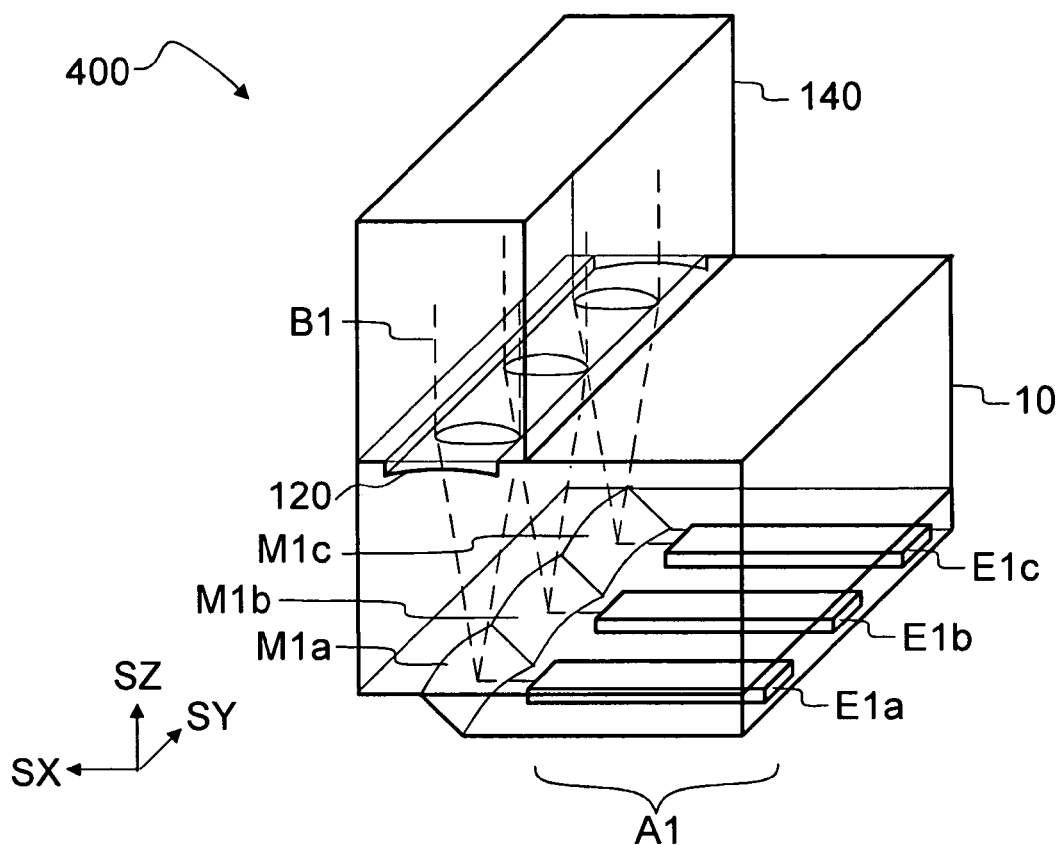
FIG. 25 shows, in a three-dimensional view, a light-emitting device comprising concave reflective structures.

Referring to FIG. 25 the inclined mirror M1 may have a concave form to reduce the divergence of the beam in the direction SY of the slow axis. The form is concave when viewed from the side of the reflected beam. The concave form may be e.g. a portion of a cylindrical, ellipsoidal, parabolic or paraboloid surface.

Thus, the light emitting device 400 may comprise several concave mirrors M1a, M1b, M1c to separately reduce the divergence of each beam emitted by the emitters E1a, E1b, E1c of an array A1.

Figure 26:
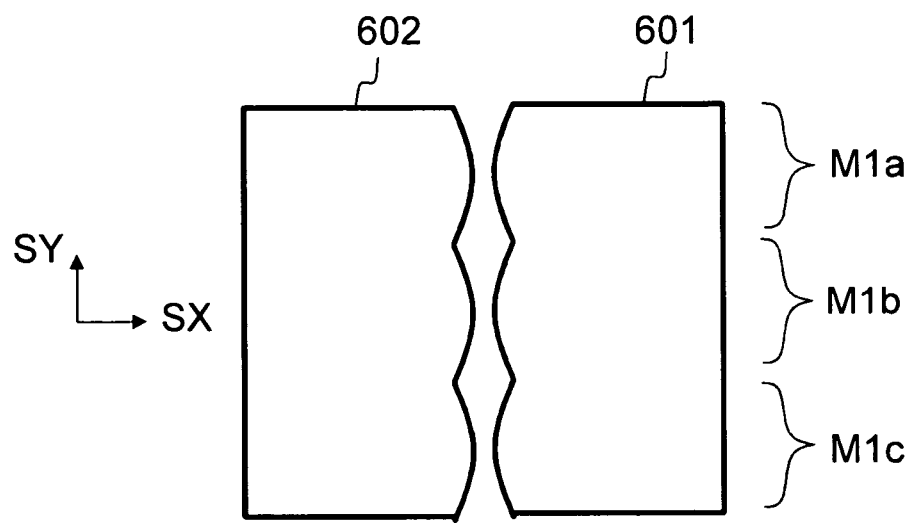
FIG. 26 shows, in a top view, masks for etching concave reflective structures.

The concave mirrors M1a, M1b, M1c may be etched by using a curved mask 601 shown in FIG. 26. FIG. 26 shows also a second mask 602 for simultaneous etching of a second series of mirrors for a second array A2 (FIG. 14

The form of the concave mirrors M1a, M1b, M1c may be etched by using Chemically Assisted Ion Beam Etching (CAIBE). The concave mirrors M1a, M1b, M1c may also be etched e.g. by a combination of physical, e.g. reactive ion etching, and chemical etching.

In general, the output of the light-emitting device 400 may be modulated by modulating the current of the gain portion 20 and/or by modulating the bias voltage of the saturable absorber 40.

The light-emitting device 400 may comprise additional filters or gratings to absorb or separate the fundamental light beam B1 from the frequency-doubled light beam B2.

The device 400 may have an additional structure such as a grating or an etalon in order to stabilize the wavelength of the light beam B1.

The emitters E1 of the light emitting device 400 may be adapted to exhibit single transverse mode operation, e.g. by arranging spatially varying loss or gain.

The wavelengths of the emitters E1 may be selected such that e.g. a wavelength 625 nm (red light), 532 nm (green light), or 465 nm (blue light) may be generated by the frequency doubling. The emitters E1a, E1b, E1c of an array A1 may be adapted to emit the same or slightly different wavelengths. Providing slightly different wavelengths reduces further the speckle contrast.

The opposite arrays A1 and A2 may be adapted to emit the same wavelength or different wavelengths.

The optical power of an emitter E1 may be controlled by adjusting the bias current of the gain regions 20, as well as by adjusting the bias voltage of the saturable absorber 40.

Red, green and blue light may be needed to select a color from the RGB-gamut. Three or more different light-emitting devices may be used. For example, green light may be provided by frequency-doubling 1064 nm light provided by an emitter E1 based on InGaAs-quantum wells (Indium Gallium Arsenide). Blue light may be provided by frequency-doubling 930 nm light provided by an emitter E1 based on InGaAs-quantum wells. Red light may be provided by frequency-doubling 1250 nm light provided by an emitter E1 based on InGaAs(N)-quantum wells (Indium Gallium Arsenide Nitride).

The different colors may be generated by using separate nonlinear crystals 140. Alternatively, a single nonlinear crystal 140 may have separate zones for generating different colors.

The color provided by a plurality of emitters may be adjusted by separately controlling the operating current of the gain regions 20 and/or by controlling the bias voltage of the saturable absorbers 40 of emitters, which have different wavelengths. Consequently, the relative fraction of red, green and blue light generated in the nonlinear crystals may be controlled.

Figure 27:
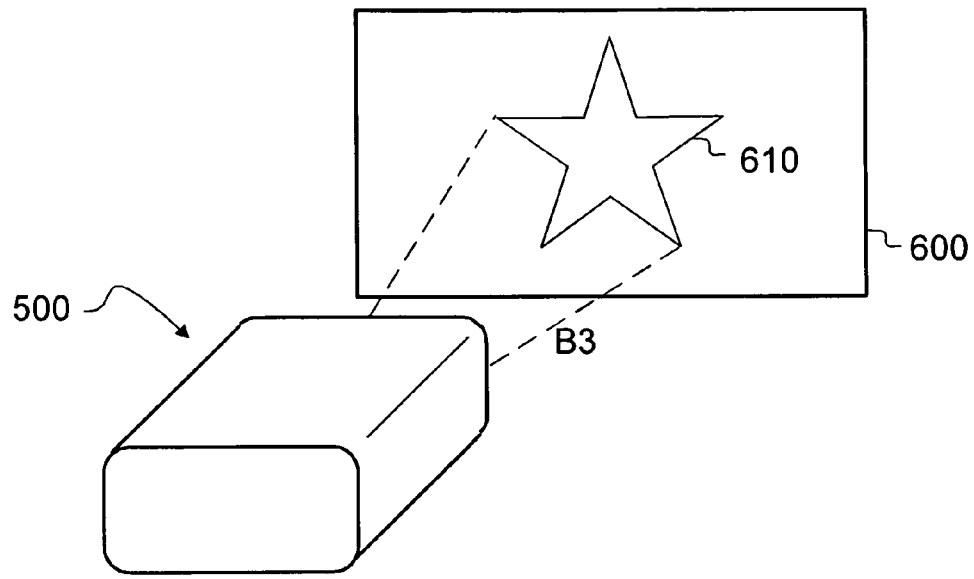
FIG. 27 shows, in a three-dimensional view, a projecting device adapted to project an image on an external screen.

Referring to FIG. 27, an image projecting device 500 may be adapted to project light rays B3 onto an external screen in order to display an image 610 to be viewed by one or more persons. The optical power of the beam B3 may be e.g. in the range of 0.05 to 5 W. Displaying images to a large audience may require even more optical power, e.g. in the range of 5 to 100 W. The image 610 may be a monochromatic image or a color image. The image 610 may be a still image or a video image.

Figure 28:
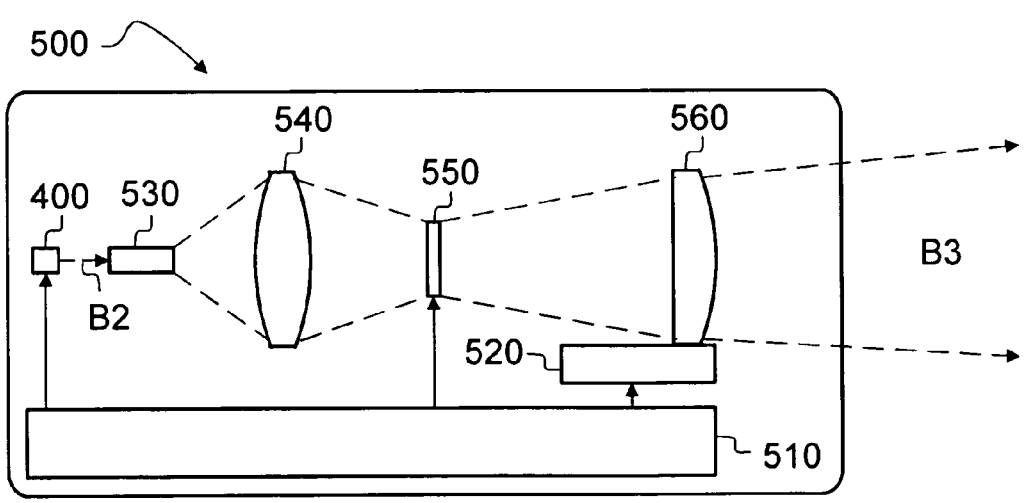
FIG. 28 shows a projecting device comprising a light-emitting device and a modulator unit.

Referring to FIG. 28, the image projecting device 500 may comprise a light source 400, an optical spatial integrator 530, a condenser 540, a modulator 550, and projecting optics 560. The light source 400 may be a light emitting device 400 according to the present invention. The light source 400 may provide a spatially non-uniform beam of visible light B2. The light beam B2 is made uniform in the spatial integrator 530, which may be e.g. an optical fiber having a sufficient length. The integrator 530 may provide a substantially uniform beam which is directed to the modulator 550 by the condenser 540. The condenser 540 may be implemented e.g. by one or more lenses or mirror surfaces. The condenser 540 may also be adapted to act as a collimator. The modulator 550 may be e.g. a two-dimensional miniature liquid crystal display or an array of micromechanically moved mirrors (MEMS display). A reflective set-up may be used instead of the transmissive arrangement shown in FIG. 28. Illuminated pixels generated by the modulator 550 are subsequently imaged to the screen 600 by the projecting optics 560. The projecting optics 560 may be implemented by one or more lenses or mirror surfaces. The projecting device 500 may further comprise an actuator 520 to adjust the distance between the array 550 and the optics 560, in order to focus the projected image 620. The light-emitting device 400, the modulator 550 and the focusing actuator 520 may be controlled by a control unit 510.

The projecting device 500 may comprise three separate modulators 550 and three separate light-emitting devices 400 to implement projecting in colors, e.g. a red-emitting device 400, a green-emitting device 400, and a blue emitting device 400 in order to allow projection of colors selected from the RGB-gamut. The projecting device 500 may comprise one red-emitting device 400, two green-emitting devices and one blue-emitting device 400 to implement a RGGB color system.

A single two-dimensional modulator array 550 illuminated with red, green, and blue light beams may also be used to implement projecting in colors, when said beams impinge on the array from different angles. Reflected light is subsequently combined and projected to the screen 600 to form a color image 610.

Figure 29A:
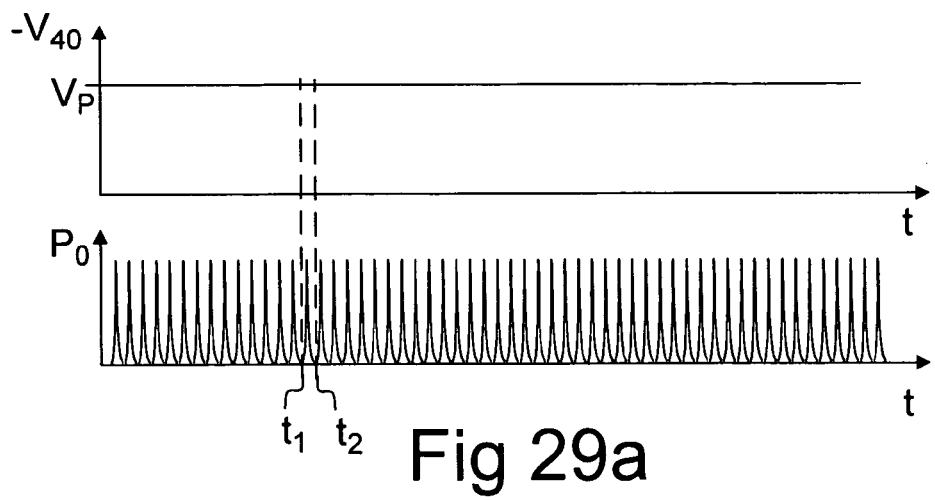
FIG. 29a shows generation of light pulses by passive Q-switching.
Figure 29B:
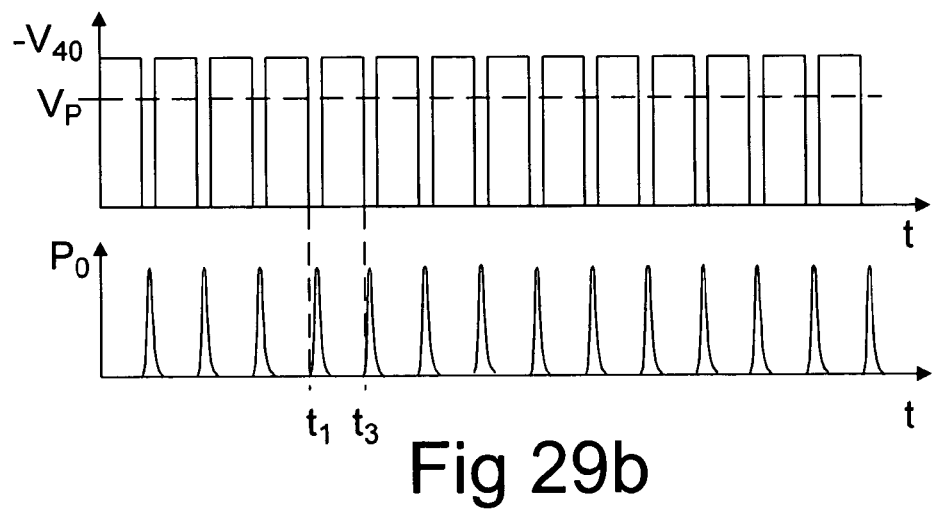
FIG. 29b shows generation of light pulses by active Q-switching.
Figure 29C:
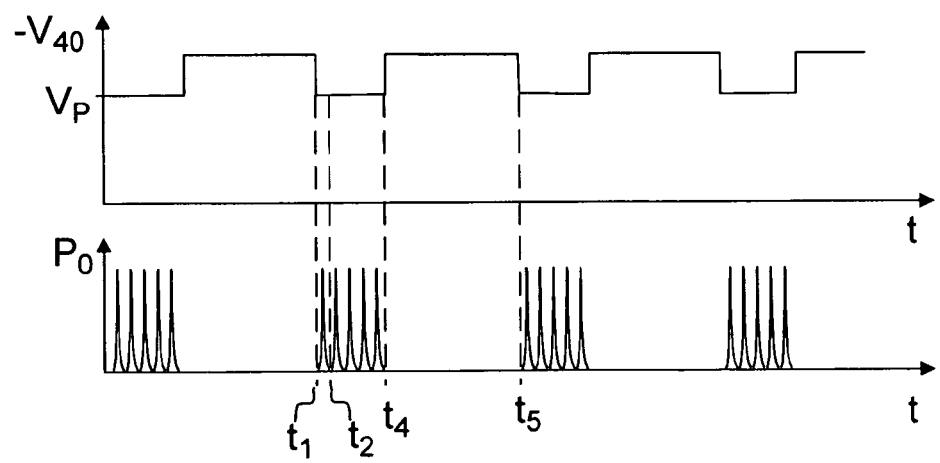
FIG. 29c shows generation or light pulse sequences by semi-passive Q-switching.

The emitters of the light emitting device 400 may be operated in a passive Q-switched, active Q-switched, or semi-passive Q-switched mode. In all these modes the gain region 20 may be driven with a substantially constant current in order to provide a substantially stable maximum population inversion in the gain region 20. The current in the gain region 20 may be selected to be high in order to provide high single-pass gain. FIG. 29a shows the passive Q-switched mode, FIG. 29b shows the active Q-switched mode, and FIG. 29c shows the semi-passive Q-switched mode. The symbol $-V_{40}$ shown in FIGS. 29a to 29c refers to negative values of the bias voltage.

In the passive Q-switched mode the bias voltage $V_{40}$ of the saturable absorber 40 is kept at a substantially constant negative level during the generation of the light pulses B1. The light pulses B1 are generated as the saturable absorber 40 is rapidly switched between the absorbing state and the non-absorbing state by the varying optical intensity. The absorber 40 is initially in the absorbing state for low-intensity light. The gain in the gain region 20 is temporarily depleted after emission of a preceding light pulse. The intensity transmitted through the absorber increases with the increasing intensity of the incident light, until the intensity reaches the saturation level of the absorber 40. The cavity losses are now suddenly reduced leading to a drastic increase in the intensity of an emitted pulse. However, generation of the light pulse temporarily also reduces the population inversion due to the spectral hole-burning effect, which provide the falling edge of the pulse. The intensity is soon reduced below a level required to set the absorber into the absorbing state, and the cycle described above may repeat itself without active modulation of the bias voltage $V_{40}$ of the absorber 40. The duration of an individual light pulse may be e.g. in the range of 500 fs to 1 ns, and the temporal separation $t_2-t_1$ between subsequent pulses may be e.g. in the range of 10 ps to 10 ns. t denotes time, $t_1$ denotes a start time of a light pulse and $t_2$ denotes a start time of a subsequent pulse.

Active Q-switching means that the bias voltage $V_{40}$ of the saturable absorber 40 is varied at a predetermined rate between a first predetermined level and a second predetermined level. Setting of the bias voltage $V_{40}$ to the first level initiates generation of a single light pulse B1, and setting of the bias voltage $V_{40}$ to the second level prevents formation of the light pulses B1. The first level may be e.g. substantially zero voltage or positive voltage, and the second level may be a negative bias voltage, which is selected to cause a high absorption in the saturable absorber 40. The light pulses B1 are generated at the rate of the variation of the bias voltage $V_{40}$. The duration of an individual pulse may be e.g. in the range of 50 ps to 1 μs, and also the temporal separation $t_3-t_1$ between subsequent pulses may be e.g. in the range of 1 ns to 10 μs. $t_1$ denotes the start time of a light pulse and $t_2$ denotes the start time of a subsequent pulse.

Semi-passive Q-switching means that generation of the light pulses B1 by passive Q-switching is enabled or disabled by varying the bias voltage $V_{40}$ of the saturable absorber 40. The bias voltage $V_{40}$ of the saturable absorber 40 is varied between a first predetermined level and a second predetermined level. Setting of the bias voltage $V_{40}$ to a first negative level enables generation of the short light pulses B1 as shown in FIG. 29b, and setting of the bias voltage $V_{40}$ to a second more negative level prevents generation of the light pulses B1. The time-averaged intensity of the output beam may be adjusted between 0% and 100% by changing a duty cycle $(t_4-t_1)/(t_5-t_1)$. In other words, the apparent intensity may be controlled by pulse width modulation. As noticed before, the integration time of a human eye is in the order of 10 ms, and a human viewer perceives the time-averaged intensity over a time period of approximately 10 ms. $t_1$ denotes a start time of a pulse sequence, $t_4$ denotes stop time of said pulse sequence, and $t_5$ denotes start time of a next pulse sequence. The time period $t_5-t_1$ may be e.g. in the range of 5 ns to 10 μs. Each pulse sequence may consist of a plurality of light pulses having temporal separation $t_2-t_1$ which is by several orders of magnitude shorter than the time period $t_5-t_1$.

Semi-passive Q-switching allows rapid modulation of the visible output intensity at a frequency which is e.g. in the range of 50 MHz to 200 MHz, while also providing a high efficiency of converting electrical energy into visible light. When compared with active Q-switching, the light generated by semi-passive Q-switching is substantially less coherent, and therefore more suitable for visual presentations.

The lasing of the light-emitting device 400 may also be controlled by modulating the bias voltage of the gain region 20. However, modulation of the bias voltage of the gain region 20 is less efficient than modulation of the bias voltage of the saturable absorber 40. Higher modulation frequencies may be implemented by modulating the saturable absorber 40 than by modulating the gain region 20. Furthermore, semi-passive Q-switching by modulating the bias voltage of the saturable absorber 40 may allow a thermally more stable operation than modulation of the current of the gain region 20.

Figure 30:
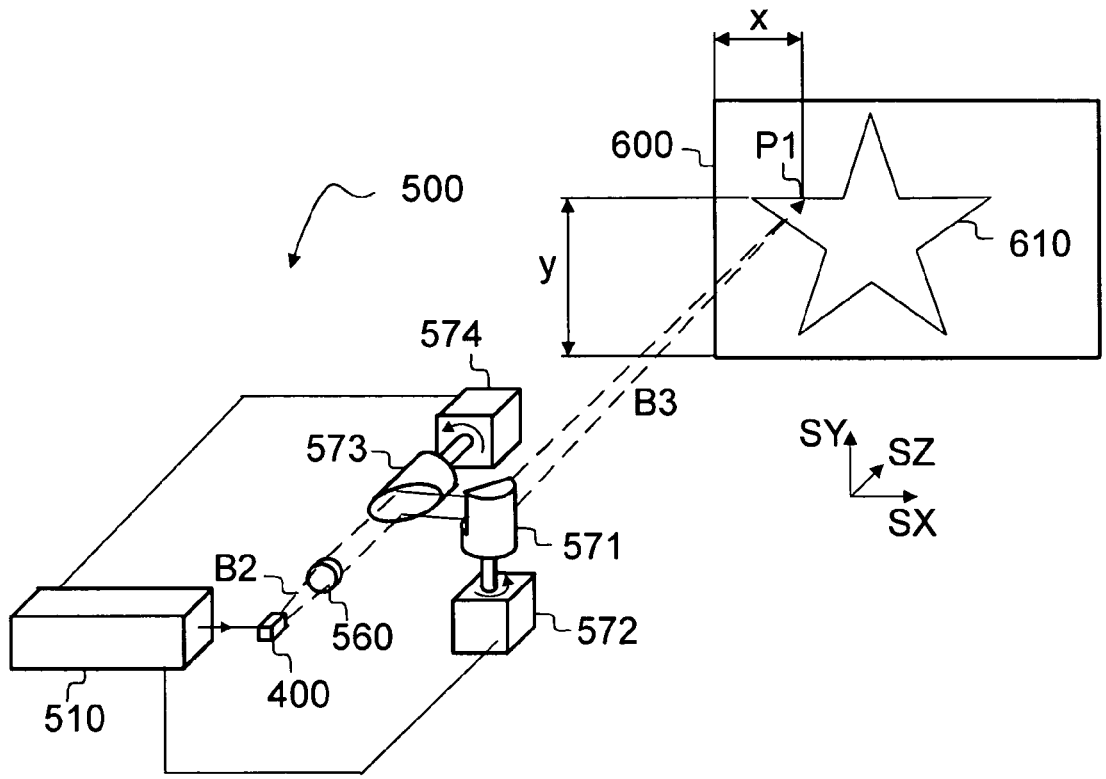
FIG. 30 shows, in a three-dimensional view, an image projector comprising two beam directing devices and a modulated light emitting device.

Referring to FIG. 30, an image projecting device 500 may comprise a light-emitting device 400, whose light beam B2 is focused on an external screen 600 by imaging optics 560. B3 denotes herein the focused light beam. The position of a focused point P1 on the screen 600 may be varied by one or more beam directing devices 571, 573. The beam directing devices may be e.g. turning mirrors or prisms which have one or more reflecting or refracting facets.

Turning of a first mirror 571 moves the focused point P1 substantially in the direction SX, i.e. changes the x-coordinate of said focused point P1. Turning of a second mirror 573 moves the focused point P1 substantially in the direction SY, i.e. changes the y-coordinate of said focused point P1. The mirrors 571, 573 may be moved by actuators 572, 574.

An image 610 may be displayed by adjusting the intensity of the beam B2 provided by the light emitting device 400 according to the horizontal position x and vertical position y of the focused point P1. The light-emitting device 400 may be operated in the semi-passive Q-switched mode, and the intensity may be adjusted by modulating the bias voltage of one or more saturable absorbers 40. A control unit 510 may be adapted to control the intensity according to the position of the focused point P1. The control unit 510 may be directly or indirectly coupled to the saturable absorbers 40 to control the intensity. The control unit 510 may be directly or indirectly coupled to the actuators 572, 574 to set the position of the focused point P1 and/or to receive a position signal from said actuators or position sensors.

The scanning speed requirement is rather high when the projector 500 is adapted to show high-resolution video images. The image rate may be e.g. higher than 80 images per second, and each image may comprise e.g. 512×1024 pixels. In order to show the video image, the intensity of the single projected beam B3 should be modulated at a frequency which is greater than 40 MHz. In order to adjust the intensity of an individual pixel by a resolution of 10%, the bias voltage of the saturable absorber 40 may be modulated at a frequency which is greater than 400 MHz. Furthermore, at least one of the beam directing devices should sweep over the image area more than 40000 times per second. Even if a rotating polygonal mirror comprises 40 facets, the rotating speed should be approximately 1000 revolutions per second. In order to implement a high sweeping rate, the beam directing device 571 and/or 573 may also be e.g. a fast micro electromechanical (MEMS) mirror, an acousto-optic deflector, or a rotating or moving holographic deflector.

Figure 31:
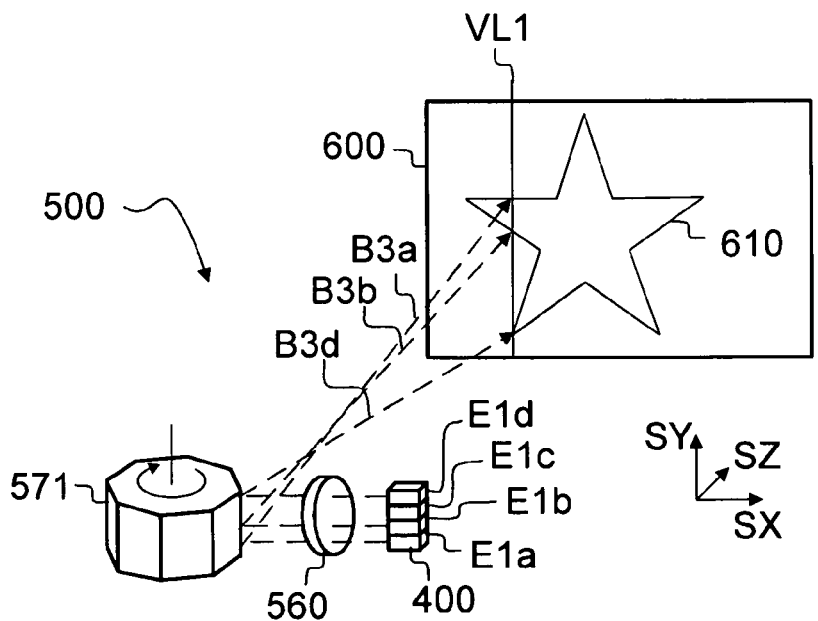
FIG. 31 shows, in a three-dimensional view, an image projector comprising a beam directing device and an array of separately modulated light emitters.

Referring to FIG. 31, an image projecting device 500 may be implemented by using one or more light-emitting devices 400 which comprise an array A1 of emitters (FIG. 13). Light beams B3a, B3b, B3d provided by the emitters E1a, E1b, E1c, E1d may be focused by imaging optics 560 on an external screen 600 to form a plurality of focused points which are on the same vertical line VL1. The horizontal position of the focused points on the screen 600 may be varied by a beam directing device 571, e.g. by a turning mirror which comprises one or more reflecting facets. The intensity of pixels in the vertical line VL1 may be controlled simultaneously by semi-passive Q-switching, i.e. by separately modulating the bias voltage of the saturable absorber 40 of each emitter E1a, E1b, E1c, E1d. Thus, the intensity of the projected beams may be separately controlled at each location of the screen in order to display an image 610. For example, the intensity of a beam (which is not shown in FIG. 31) provided by emitter E1c may be temporarily set to zero. The image projecting device 500 may also comprise an actuator 572 and a control unit 510 described with reference to FIG. 30. Different emitter arrays may be stacked to implement different RGB color projection, or a single array may comprise interlaced emitters for displaying different colors.

The light emitting device 400 may comprise e.g. 512 separately controlled emitters E1a, E1b, E1c, E1d. The rotating mirror 571 may comprise e.g. eight facets, and the mirror 571 may rotate at a rate of e.g. 12.5 revolutions per second. Thus the light beams B3a, B3b, B3d sweep over the screen 100 times per second. Now, a modulation frequency of 20 MHz coupled to a saturable absorber 40 of an emitter would allow 1024 separately controlled pixels in the horizontal direction at the image rate of 100 per second, while also allowing 1% resolution in adjusting the intensity, and allowing complete blanking of the emitted beam during the times when said beam impinges on two adjacent facets of the turning mirror 571.

Figure 32:
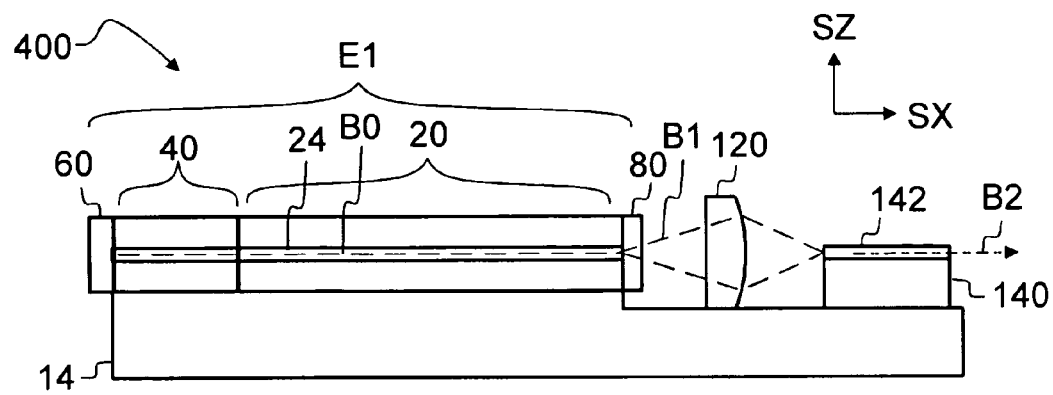
FIG. 32 shows, in a side view, a linear light emitting device without the inclined reflecting structure.
Figure 33:
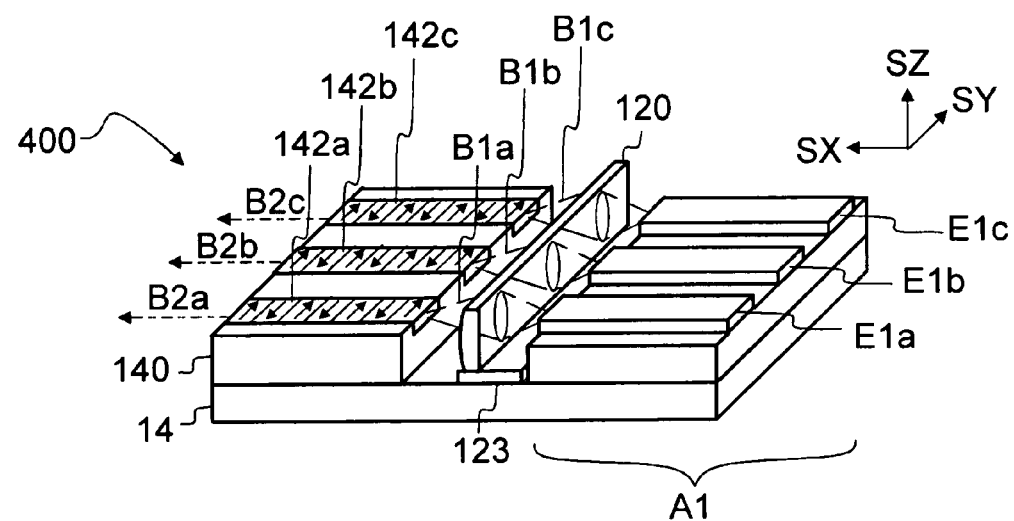
FIG. 33 shows, in a three-dimensional view, a linear light emitting device comprising several emitters.

Referring to FIG. 32, a light emitting device 400 may also be implemented in a substantially linear manner without an inclined reflecting structure M1. However, on-wafer testing may be more difficult, the risk of catastrophic optical damage (COD) may be higher, correct alignment of the nonlinear crystal may be more difficult and/or the implementation of antireflection coatings may be more difficult than with the folded designs. The saturable absorber 40, the gain region 20, the nonlinear crystal 140 and the light-concentrating structure 120 may be implemented on a mounting substrate 14. The linear light-emitting device 400 may comprise a nonlinear crystal 140 according to FIGS. 11, 12, 19a-20c. In particular, the nonlinear crystal 140 may comprise a waveguide and it may be periodically poled. The nonlinear crystal may further comprise a Bragg grating 82 to provide narrowband feedback. Referring to FIG. 33, the light emitting device 400 may comprise several emitters E1a, E1b, E1c as described above with reference to FIGS. 1 to 12 but without the inclined reflecting structure M1. The correct position of the lens 120 may be set e.g. by selecting the thickness of a spacer 123.

For the person skilled in the art, it will be clear that modifications and variations of the devices according to the present invention are perceivable. The figures are schematic. The particular embodiments described above with reference to the accompanying drawings are illustrative only and not meant to limit the scope of the invention, which is defined by the appended claims.

What is claimed is:
1. A light emitting device comprising:
 a waveguide having an electrically pumped gain region,
 a saturable absorber,
 a reflecting structure,
 a substrate, and a nonlinear medium, wherein said saturable absorber and said gain region are adapted to emit first light pulses from an end of said waveguide, said reflecting structure being adapted to reflect said first light pulses into said nonlinear medium, said nonlinear medium being adapted to generate second light pulses such that the optical frequency of said second light pulses is two times the optical frequency of said first light pulses; said gain region, said saturable absorber and said reflecting structure being implemented on said substrate such that said reflecting structure is adapted to change the direction of said first light pulses by an angle which is in the range of 70 to 110 degrees.

2. The device of claim 1 further comprising a partially reflecting structure to define an optical cavity together with a back reflector, said optical cavity comprising said gain region.

3. The device of claim 1 comprising a plurality of substantially parallel waveguides adapted to emit said first light pulses, the first light pulses emitted by said plurality of waveguides being coupled into a single nonlinear crystal.

4. The device of claim 1 wherein said first light pulses are adapted to pass through said common substrate.

5. The device of claim 1 further comprising a light-concentrating structure to collimate or focus light into said nonlinear crystal.

6. The device of claim 5 wherein said light-concentrating structure is a substantially cylindrical surface adapted to collimate or focus light in the direction of a fast axis of said first light pulses.

7. The device of claim 6 wherein said substrate has a cylindrical surface.

8. The device of claim 1 comprising a further waveguide to confine light of said first light pulses, said further waveguide comprising said nonlinear medium.

9. The light-emitting device of claim 8 wherein said waveguide comprises a tapered portion to concentrate light into a narrow part of said waveguide.

10. The device of claim 8 wherein said non-linear medium is a crystal having one or more convex facets to refract said first light pulses into said further waveguide.

11. The device of claim 1 wherein said reflecting structure has convex or concave form to change the divergence of said first light pulses.

12. The device of claim 1 wherein the first light pulses introduced into said nonlinear medium have a predetermined polarization, and said nonlinear medium has periodically poled zones to provide quasi phase matching such that said second light pulses are in the same phase for each poling period, the orientation of said zones being matched with polarization of said first light pulses.

13. The device of claim 12 further comprising a polarization-rotating element.

14. The device of claim 2 wherein said partially reflecting structure is a Bragg grating.

15. The device of claim 14 comprising a Bragg grating implemented on or in a nonlinear crystal to provide optical feedback through said nonlinear medium.

16. A method for generating light pulses by using a waveguide having an electrically pumped gain region, a saturable absorber, a reflecting structure, a substrate, and a nonlinear medium, said gain region, said saturable absorber and said reflecting structure being implemented on said substrate, said method comprising:

providing first light pulses from an end of said waveguide by using said saturable absorber and said gain region, changing the direction of said first light pulses by an angle which is in the range of 70 to 110 degrees by said reflecting structure, and coupling said first light pulses into said nonlinear medium in order to generate second light pulses such that the optical frequency of said second light pulses is two times the optical frequency of said first light pulses.

17. The method of claim 16 further comprising changing the bias voltage of said saturable absorber between a first voltage level and a second voltage level.

18. A projecting device comprising:

a light source, and projecting optics, said light source in turn comprising a waveguide having an electrically pumped gain region, a saturable absorber, a reflecting structure, a substrate, and a nonlinear medium, wherein said saturable absorber and said gain region are adapted to emit first light pulses from an end of said waveguide, said reflecting structure being adapted to reflect said first light pulses into said nonlinear medium, said nonlinear medium being adapted to generate second light pulses such that the optical frequency of said second light pulses is two times the optical frequency of said first light pulses; said gain region, said saturable absorber and said reflecting structure being implemented on said substrate such that said reflecting structure is adapted to change the direction of said first light pulses by an angle which is in the range of 70 to 110 degrees.

19. The projecting device of claim 18 comprising a two-dimensional modulator array.

20. The projecting device of claim 18 comprising at least one beam directing device, wherein said first light pulses are adapted to be generated by semi-passive Q-switching.

* * * * *